(12) United States Patent
Wong et al.

(10) Patent No.: US 9,064,700 B2
(45) Date of Patent: Jun. 23, 2015

(54) CRYSTALLIZATION ANNEALING PROCESSES FOR PRODUCTION OF CIGS AND CZTS THIN-FILMS

(75) Inventors: Kaichiu Wong, Mountain View, CA (US); Erik Sean Smith, Los Gatos, CA (US); Christ Willie Ford, San Jose, CA (US)

(73) Assignee: ZETTA RESEARCH AND DEVELOPMENT LLC - AQT SERIES, Wilmington, DE (US)

( * ) Notice: Subject to any disclaimer, the term of this patent is extended or adjusted under 35 U.S.C. 154(b) by 401 days.

(21) Appl. No.: 13/467,904

(22) Filed: May 9, 2012

(65) Prior Publication Data
US 2013/0217177 A1     Aug. 22, 2013

Related U.S. Application Data

(63) Continuation-in-part of application No. 13/401,512, filed on Feb. 21, 2012, and a continuation-in-part of application No. 13/401,558, filed on Feb. 21, 2012.

(51) Int. Cl.
| | |
|---|---|
| *H01L 21/00* | (2006.01) |
| *H01L 21/02* | (2006.01) |
| *H01L 31/032* | (2006.01) |
| *C23C 16/30* | (2006.01) |
| *C23C 16/56* | (2006.01) |

(52) U.S. Cl.
CPC ...... *H01L 21/02557* (2013.01); *H01L 31/0322* (2013.01); *H01L 31/0326* (2013.01); *H01L 21/0256* (2013.01); *H01L 21/02568* (2013.01); *H01L 21/02667* (2013.01); *C23C 16/306* (2013.01); *C23C 16/56* (2013.01); *Y02E 10/541* (2013.01)

(58) Field of Classification Search
CPC ................ H01L 31/0322; H01L 31/03226; H01L 31/18; H01L 31/206; H01L 21/0257
USPC ........................................................ 438/95
See application file for complete search history.

(56) References Cited

U.S. PATENT DOCUMENTS

| | | | |
|---|---|---|---|
| 2007/0163642 A1* | 7/2007 | Van Duren et al. | 136/262 |
| 2007/0257255 A1* | 11/2007 | Dhere et al. | 257/40 |
| 2008/0280030 A1* | 11/2008 | Van Duren et al. | 427/74 |

* cited by examiner

*Primary Examiner* — Colleen A Matthews
*Assistant Examiner* — Quovaunda V Jefferson
(74) *Attorney, Agent, or Firm* — Mattingly & Malur, PC

(57) ABSTRACT

In one embodiment, a method includes depositing a chalcogenide precursor layer onto a substrate, and annealing the precursor layer in the presence of a gaseous phase comprising volatile species, the partial pressure of each volatile species being approximately constant over substantially all of the surface of the precursor layer, the partial pressure of each species being between approximately 0.1 mTorr and 760 Torr, where the presence of the gaseous phase reduces decomposition of volatile species from the precursor layer during annealing.

24 Claims, 20 Drawing Sheets

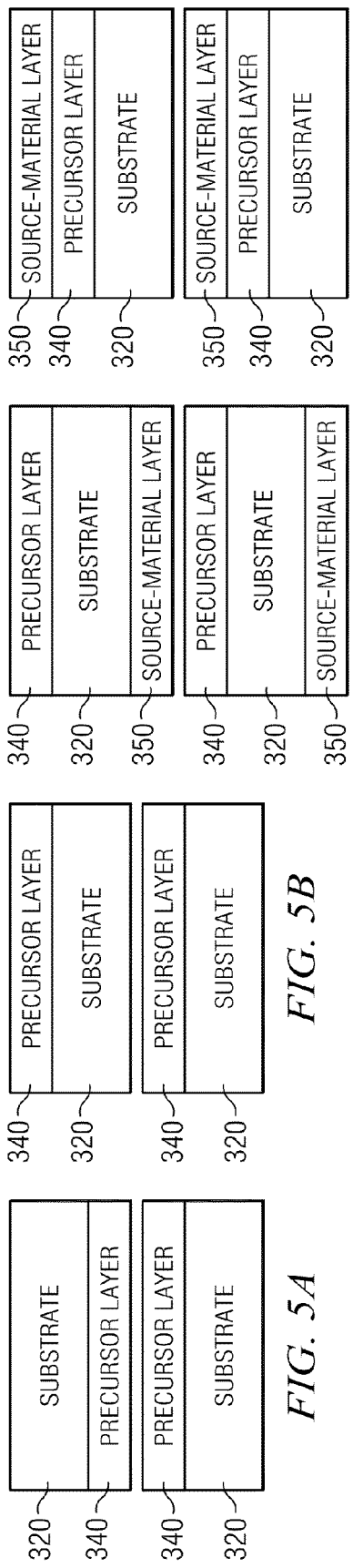
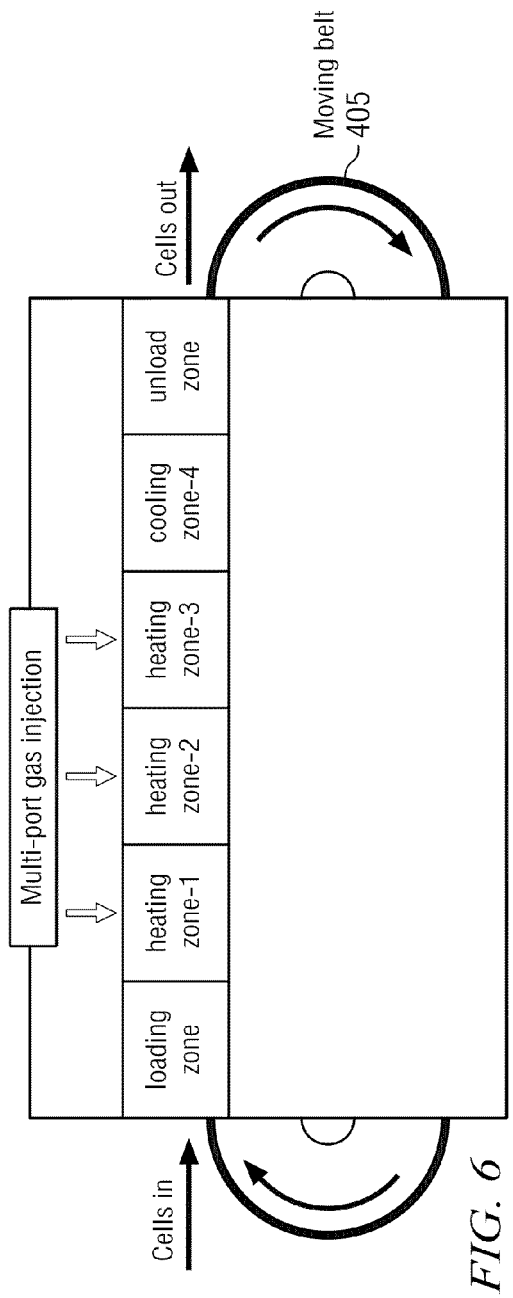

CRYSTALLIZATION ANNEALING PROCESSES FOR PRODUCTION OF CIGS AND CZTS THIN-FILMS

RELATED APPLICATIONS

This application is a continuation-in-part under 35 U.S.C. §120 of U.S. patent application Ser. No. 13/401,512, filed 21 Feb. 2012, and of U.S. patent application Ser. No. 13/401,558, filed 21 Feb. 2012, both of which are incorporated herein by reference.

TECHNICAL FIELD

This disclosure generally relates to the manufacturing of photovoltaic devices, and in particular to annealing processes for producing thin-film photovoltaic devices.

BACKGROUND

A typical photovoltaic cell includes a p-n junction, which can be formed by a layer of n-type semiconductor in direct contact with a layer of p-type semiconductor. The electronic differences between these two materials create a built-in electric field and potential difference. When a p-type semiconductor is placed in intimate contact with an n-type semiconductor, then a diffusion of electrons can occur from the region of high electron-concentration (the n-type side of the junction) into the region of low electron-concentration (the p-type side of the junction). The diffusion of carriers does not happen indefinitely, however, because of an opposing electric field created by the charge imbalance. The electric field established across the p-n junction induces separation of charge carriers that are created as result of photon absorption. When light is incident on this junction, the photons can be absorbed to excite pairs of electrons and holes, which are "split" by the built-in electric field, creating a current and voltage.

The majority of photovoltaic cells today are made using relatively thick pieces of high-quality silicon (approximately 200 μm) that are doped with p-type and n-type dopants. The large quantities of silicon required, coupled with the high purity requirements, have led to high prices for solar panels. Thin-film photovoltaic cells have been developed as a direct response to the high costs of silicon technology. Thin-film photovoltaic cells typically use a few layers of thin-films (≤5 μm) of low-quality polycrystalline materials to mimic the effect seen in a silicon cell. A basic thin-film device consists of a substrate (e.g., glass, metal foil, plastic), a metal-back contact, a 1-5 μm semiconductor layer to absorb the light, another semiconductor layer to create a p-n junction and a transparent top conducting electrode to carry current. Since very small quantities of low-quality material are used, costs of thin-film photovoltaic cells can be lower than those for silicon.

Thin-film photovoltaic cells are often manufactured using chalcogenide materials (sulfides, selenides, and tellurides). A chalcogenide is a chemical compound consisting of at least one chalcogen ion (group 16 (VIA) elements in the periodic table, e.g., sulfur (S), selenium (Se), and tellurium (Te)) and at least one more electropositive element. Chalcogenide (both single and mixed) semiconductors have optical band gaps well within the terrestrial solar spectrum, and hence, may be used as photon absorbers in thin-film photovoltaic cells to generate electron-hole pairs and convert light energy to usable electrical energy. The two primary chalcogenide technologies in the thin-film solar space are copper-indium/gallium-sulfide/selenide (CIGS) and cadmium-tellurium (CdTe). CIGS and CdTe photovoltaic cells have lower costs-per-watt produced than silicon-based cells and are making significant inroads into the photovoltaic market. However, CIGS and CdTe technologies are likely to be limited by the potential higher costs, lower material availability, and toxicity of some of their constituent elements (e.g., indium, gallium, tellurium, cadmium). More recently, chalcogenide thin-films using copper-zinc-tin-sulfide/selenide (CZTS) have been developed.

BRIEF DESCRIPTION OF THE DRAWINGS

FIGS. 5A-5D illustrate example configurations for arranging multiple substrates in a closed-space annealing apparatus.

FIG. 6 illustrates an example furnace for annealing.

DESCRIPTION OF EXAMPLE EMBODIMENTS

CZTS Materials Generally

Figure 1A:
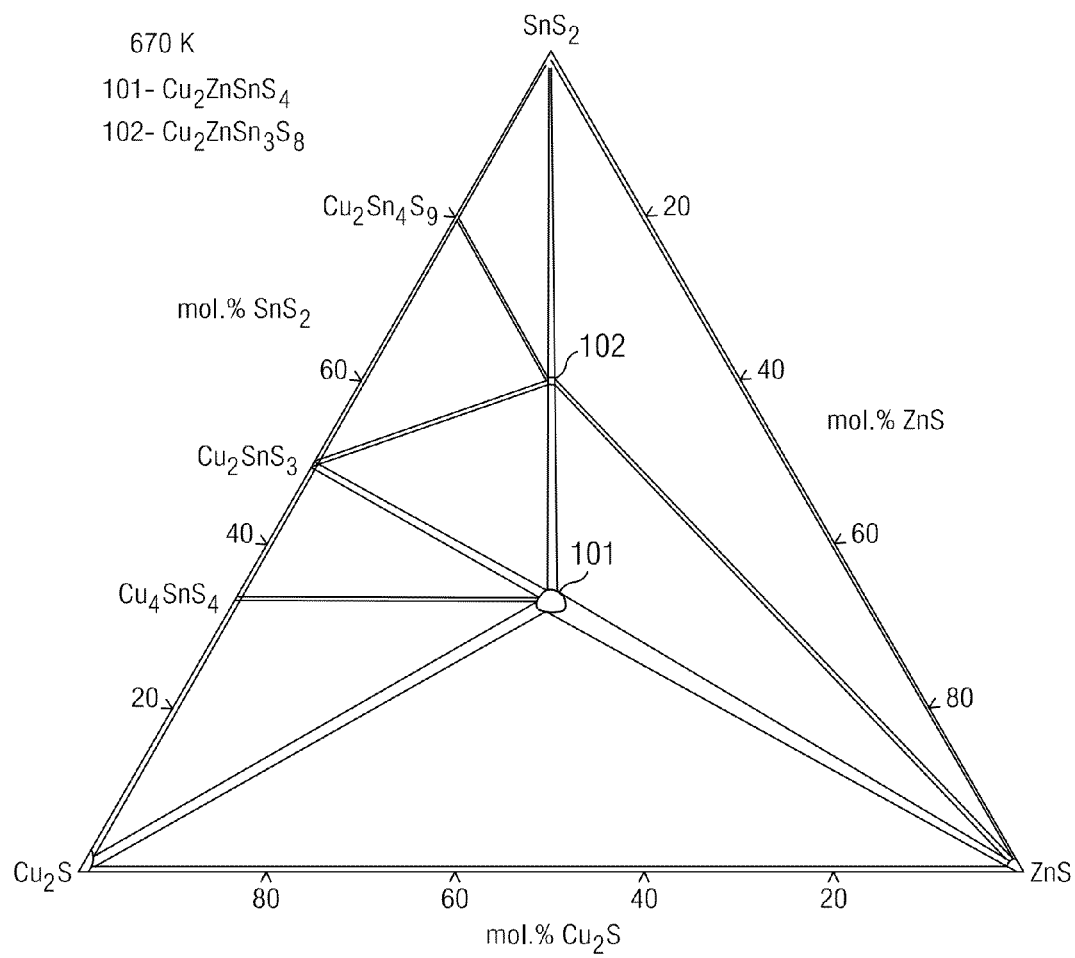
FIG. 1A illustrates a phase diagram for $SnS$—$Cu_2S$—$ZnS$ systems at 670 K.

In particular embodiments, a thin-film in a photovoltaic cell may be manufactured using copper-zinc-tin-sulfide/selenide (CZTS). CZTS materials have a favorable direct band gap (1.4-1.5 eV), a large absorption coefficient ($>10^4$ cm$^{-1}$), and are formed entirely from non-toxic, abundant elements that are produced in large quantities. CZTS also shares a number of similarities with CIGS as the equipment and processes used for deposition of these two materials are very similar. CZTS materials can be synthesized through solid-state chemical reactions between Zn(S, Se), Cu$_2$(S, Se), and Sn(S, Se)$_2$. FIG. 1A illustrates an isothermal phase diagram for SnS—Cu$_2$S—ZnS systems at 670 K. As illustrated in the phase diagram, Cu$_2$ZnSnS$_4$ forms in this system in region 101, while Cu$_2$ZnSn$_3$S$_8$ forms in region 102.

Figure 2:
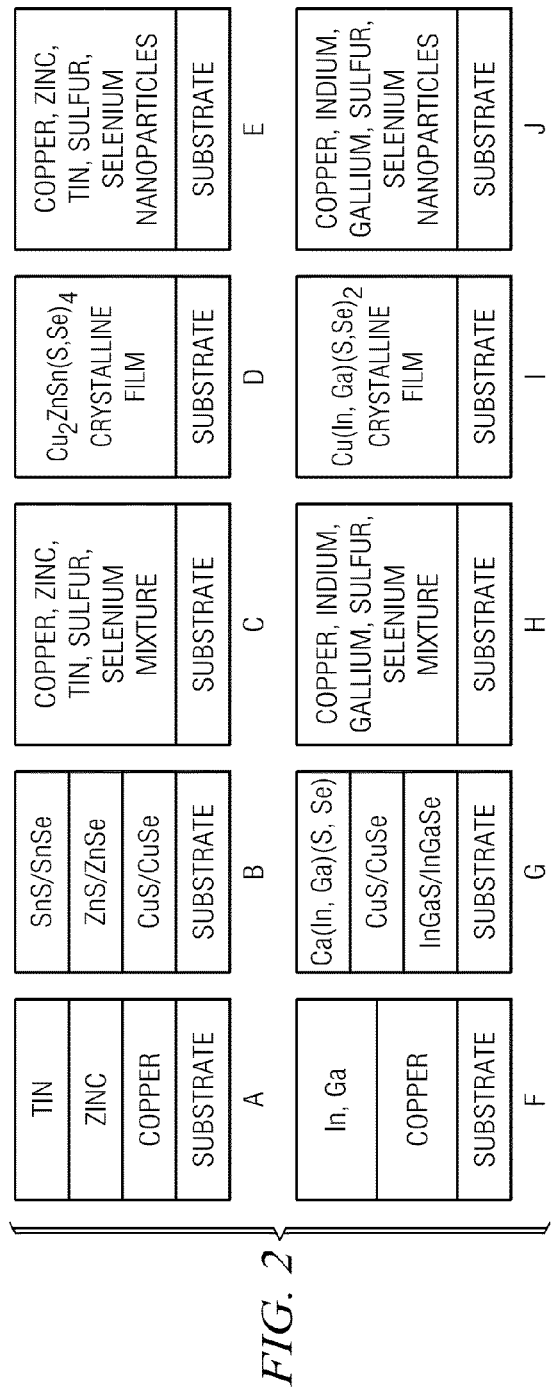
FIGS. 2A-2J illustrates example precursor layer architectures.

In particular embodiments, a fabrication apparatus may deposit a CZTS precursor layer onto a substrate. The precursor layer may comprise Cu, Zn, Sn, and one or more of S or Se. FIGS. 2A-2E illustrates example precursor layer architectures. In each example, the precursor layer is deposited on a suitable substrate. FIG. 2A illustrates an example precursor layer comprising of film layers of copper, zinc, and tin. In order to form a suitable CZTS material, one or more of sulfur or selenium may later be deposited onto the precursor layer, such as, for example, during a separate deposition step or during annealing. FIG. 2B illustrates an example precursor layer comprising: a film layer comprising Cu$_a$S$_b$/Cu$_a$Se$_b$, where approximately $0.5 \leq a \leq 2$ and approximately $b=1$, a film layer comprising Zn$_c$S$_d$/Zn$_c$Se$_d$, where approximately $0.5 \leq c \leq 2$ and approximately $d=1$, and a film layer comprising Sn$_e$S$_f$/Sn$_e$Se$_f$, where approximately $0.5 \leq e \leq 2$ and approximately $f=1$. The use of sulfide and selenide layers can be used to control the sulfur-to-selenium ratio in the precursor layer. In FIGS. 2A and 2B, the film layers may be deposited sequentially, with minimal mixing between the film layers. The layers in FIGS. 2A and 2B may be arranged in any suitable order, may have any suitable thickness, and each layer may have a different thickness. The thickness of the layers in FIGS. 2A and 2B may be used to control the composition of the initial precursor film and the final post-annealing film. FIG. 2C illustrates an example precursor layer comprising a mixture of copper, zinc, tin, sulfur, and selenium. Any suitable combination of these elements may be used. As another example, the precursor layer may comprise approximately 5-50 atomic % Cu, approximately 5-50 atomic % Zn, approximately 5-50 atomic % Sn, approximately 5-50 atomic % S, and approximately 5-50 atomic % Se. As yet another example, the precursor layer may comprise Cu$_x$Zn$_y$Sn$_z$(S$_\alpha$Se$_{1-\alpha}$)$_\beta$, where approximately $0.5 \leq x \leq 3$, approximately $y=1$, approximately $0.5 \leq z \leq 3$, approximately $0 \leq \alpha \leq 5$, and approximately $0 \leq \beta \leq 5$. FIG. 2D illustrates an example precursor layer comprising a CZTS crystalline film (Cu$_2$ZnSn(S, Se)$_4$). For example, the crystalline film may be deposited using physical-vapor deposition at high-temperature such that the crystalline phase is formed during deposition. FIG. 2E illustrates an example precursor layer comprising nanoparticles of the constituent elements (Cu, Zn, Sn, S, Se) or compounds of the constituent elements (e.g., ZnS, SnS, ZnSe, SnSe). Although FIGS. 2A-2E illustrate particular precursor layers with particular compositions and architectures, this disclosure contemplates any suitable precursor layers with any suitable compositions or architectures.

CIGS Materials Generally

Figure 1B:
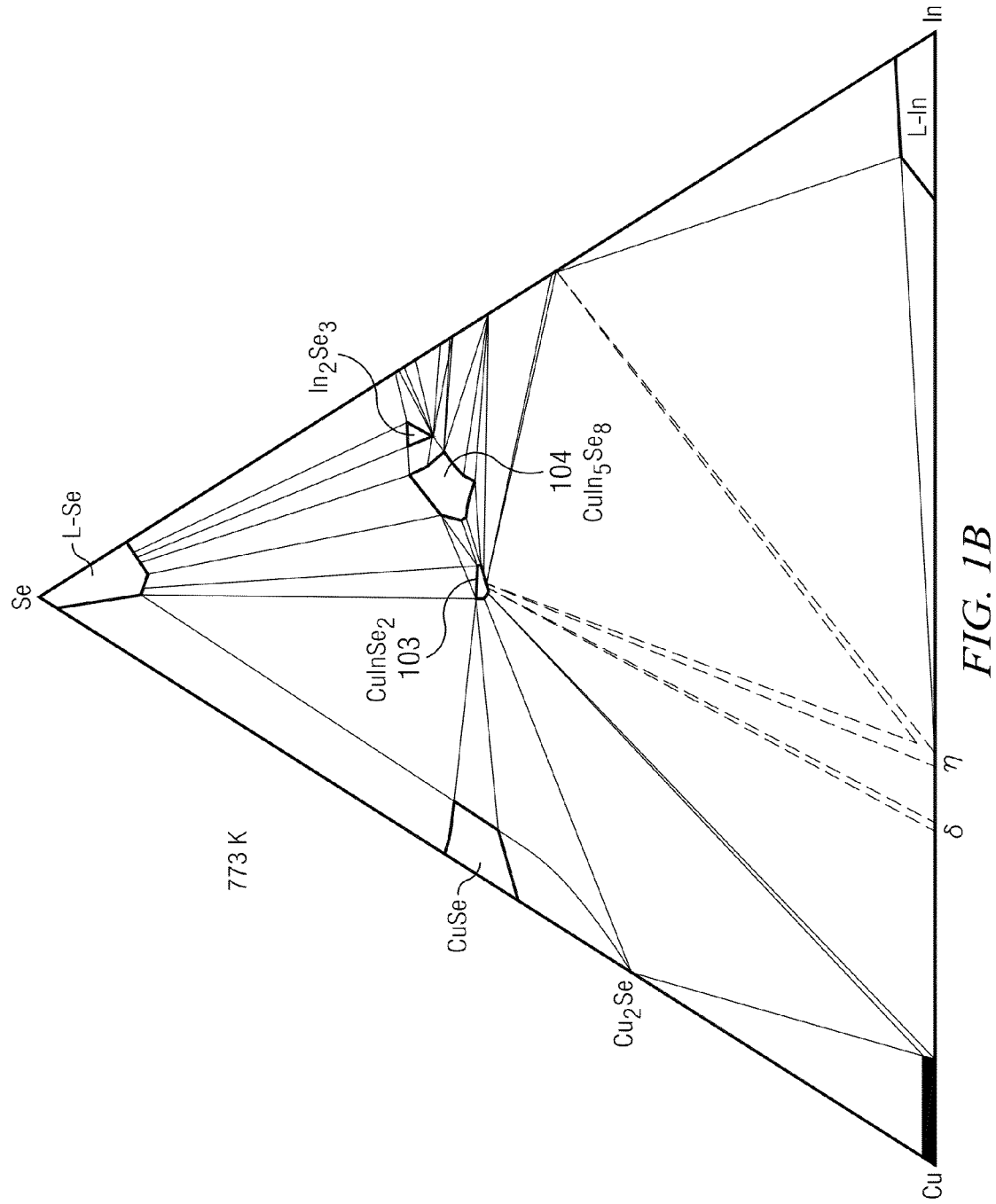
FIG. 1B illustrates a phase diagram for Cu—Se—In systems at 773 K.

In particular embodiments, a thin-film in a photovoltaic cell may be manufactured using copper-indium/gallium-sulfide/selenide (CIGS). CIGS material have a favorable direct band gap (1.04-1.67 eV) and a large absorption coefficient ($>10^5$ cm$^{-1}$). CIGS also shares a number of similarities with CZTS as the equipment and processes used for deposition of these two materials are very similar. CIGS material can be synthesized through solid-state chemical reactions between Cu$_2$(S, Se), and (In, Ga)(S, Se)$_2$. FIG. 1B illustrates an isothermal phase diagram for Cu—Se—In systems at 773 K. As illustrated in the phase diagram, CuInSe$_2$ forms in this system in region 103, while CuIn$_5$Se$_8$ forms in region 104.

In particular embodiments, a fabrication apparatus may deposit a CIGS precursor layer onto a substrate. The precursor layer may comprise Cu, one or more of In or Ga, and one or more of S or Se. FIGS. 2F-2J illustrates example precursor layer architectures. In each example, the precursor layer is deposited on a suitable substrate. FIG. 2F illustrates an example precursor layer comprising: a film layer comprising copper; a film layer comprising indium and/or gallium; and a film layer comprising sulfur and/or selenium. In order to form a suitable CIGS material, one or more of sulfur or selenium may later be deposited onto the precursor layer, such as, for example, during a separate deposition step or during annealing. FIG. 2G illustrates an example precursor layer comprising: a film layer comprising (In$_y$Ga$_{(1-y)}$)$_\alpha$Se$_z$/(In$_y$Ga$_{(1-y)}$)$_\alpha$S$_z$, where approximately $0 \leq y \leq 1$, $0.5 \leq z \leq 1$, and $0.5 \leq \alpha \leq 1$; a film layer comprising Cu$_{2-x}$Se$_z$, Cu$_{2-x}$S$_z$, or any combination thereof, where approximately $0 \leq x \leq 1.6$, and $z=1$; and a film layer comprising Cu$_x$(In$_y$Ga$_{(1-y)}$)$_\alpha$(S$_z$Se$_{1-z}$)$_\beta$, where approximately $0.1 \leq x \leq 0.7$, $0 \leq y \leq 1$, $0 \leq z \leq 1$, $0.3 \leq \alpha \leq 0.8$, and $\beta=1$. The use of sulfide and selenide layers can be used to control the sulfur-to-selenium ratio in the precursor layer. In FIGS. 2F and 2G, the film layers may be deposited sequentially, with minimal mixing between the film layers. The layers in FIGS. 2F and 2G may be arranged in any suitable order, may have any suitable thickness, and each layer may have a different thickness. The thickness of the layers in FIGS. 2F and 2G may be used to control the composition of the initial precursor film and the final post-annealing film. FIG. 2H illustrates an example precursor layer comprising a mixture of copper, indium, galium, sulfur, and selenium. Any suitable combination of these elements may be used. As another example, the precursor layer may comprise approximately 5-50 atomic % Cu, approximately 5-50 atomic % In and Ga combined, and 5-50 atomic % S and Se combined. As yet another example, the precursor layer may comprise Cu$_x$(In$_y$Ga$_{(1-y)}$)$_\alpha$(S$_z$Se$_{1-z}$)$_\beta$, and wherein approximately $0.1 \leq x \leq 0.7$, $0 \leq y \leq 1$, $0 \leq z \leq 1$, $0.3 \leq \alpha \leq 0.8$, and $\beta=1$. FIG. 2I illustrates an example precursor layer comprising a CZTS crystalline film (Cu(In, Ga)(S, Se)$_2$). For example, the crystalline film may be deposited using physical-vapor deposition at high-temperature such that the crystalline phase is formed during deposition. FIG. 2J illustrates an example precursor layer comprising nanoparticles of the constituent elements (Cu, In, Ga, S, Se) or compounds of the constituent elements (e.g., In$_2$S$_3$, In$_2$Se$_3$, Ga$_2$S$_3$, Ga$_2$Se$_3$, CuSe, CuSe$_2$). Although FIG. 2F-2J illustrate particular precursor layers with particular compositions and architectures, this disclosure contemplates any suitable precursor layers with any suitable compositions or architectures. For example, in particular embodiments, the In or Ga in a CIGS precursor layer may be substituted in whole or in part with another suitable material, such as, for example, Al, Ag, or any combination thereof.

Manufacturing Chalcogenide Photovoltaic Cells

In particular embodiments, the CZTS and CIGS fabrication processes may consist of two main steps. First, a precursor comprising a combination of the constituent elements (for CZTS: copper, zinc, tin, sulfur, selenium; for CIGS: copper, indium, gallium, sulfur, selenium) may be deposited onto a substrate to form a precursor layer. Any suitable combination of the constituent elements may be used. The substrate is typically coated with a suitable electrode material. Deposition of the precursor layer may be performed using any suitable thin-film deposition process, such as, for example, chemical-vapor deposition, evaporation, atomic-layer deposition, sputtering, particle coating, spray pyrolysis, spin-coating, electro-deposition, electrochemical deposition, photoelectrochemical deposition, hot-injection, chemical-bath deposition, spin coating, another suitable deposition process, or any combination thereof. The various constituent elements of the precursor layer may be intermixed or deposited in discrete layers. Depositing discrete layer may facilitate bandgap grading through selectively compositional variation of the constituent elements. Second, the precursor may be annealed at high temperature (approximately >400° C.) to form the CZTS or CIGS crystalline phase. However, a single-step process may also be used where deposition and annealing are preformed as a single process, and such a process may generate substantially the same end results.

Chalcogenide films may be unstable at high temperatures and thus ideal compositional stoichiometries can be difficult to maintain. Furthermore, the annealing conditions used to form the crystalline phase may create electronic defects in the chalcogenide film. For example, at temperatures greater than 450° C., crystalline CZTS can decompose and volatile constituent materials may evaporate/sublime from the film. In particular embodiments, CZTS may decompose according to the following reaction scheme:

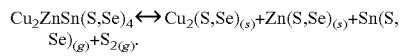

In this reaction, tin sulfide and sulfur gas are evaporated/sublimed from a crystalline CZTS film at high temperature. As another example, at temperatures greater than 250° C., crystalline CIGS can decompose and volatile constituent materials may evaporate/sublime from the film. In particular embodiments, CIGS may decompose according to the following reaction scheme:

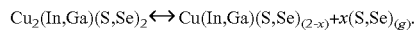

In this reaction, indium-sulfide and sulfur gas are evaporated/sublimed from a crystalline CIGS film at high temperature. This means that for the CZTS or CIGS decomposition reactions to proceed in the forward direction, In(S, Se), Sn(S, Se), $S_2$, and/or $S_8$ gas must be evaporated/sublimated from the film. Evolution of a gaseous phase in a reaction must also lead to an increase in the total pressure of the system. The loss of constituent material via these decomposition reactions may create electronic defects that are detrimental to chalcogenide thin-film device performance. Although this disclosure describes particular decomposition reactions for CZTS and CIGS, this disclosure contemplates any suitable decomposition reactions for CZTS and CIGS.

In particular embodiments, the precursor layer may be annealed at high-temperature while controlling the stoichiometry of the layer and reducing or suppressing the decomposition of the chalcogenide material. Chalcogenide films manufactured in this way may be device-quality, that is, the film may be incorporated into a photovoltaic device and used to generate electricity from light at a reasonable efficiency. The decomposition of CZTS and CIGS films at high temperature may be reduced or suppressed by controlling the formation of decomposition products (e.g., gaseous In(S, Se), Sn(S, Se), $S_2$, $S_8$, $Se_2$) during the annealing process. For example, if the partial pressure of gaseous In(S, Se), Sn(S, Se), $S_2$, $S_8$, and/or $Se_2$ in the annealing apparatus is maintained at or above the equilibrium vapor pressure of the gaseous component, the decomposition of the CZTS or CIGS film can be suppressed or even reversed. This may be achieved, for example, by annealing the chalcogenide film in a constrained or controlled volume where the partial pressure of gaseous decomposition products may be controlled. The annealing processes described herein may also permit control over the uniformity, microstructure, surface quality, stoichiometry, and various other physical, mechanical, and electrical attributes of a chalcogenide film.

Annealing Chalcogenide Layers in a Constrained Volume

Figure 3:
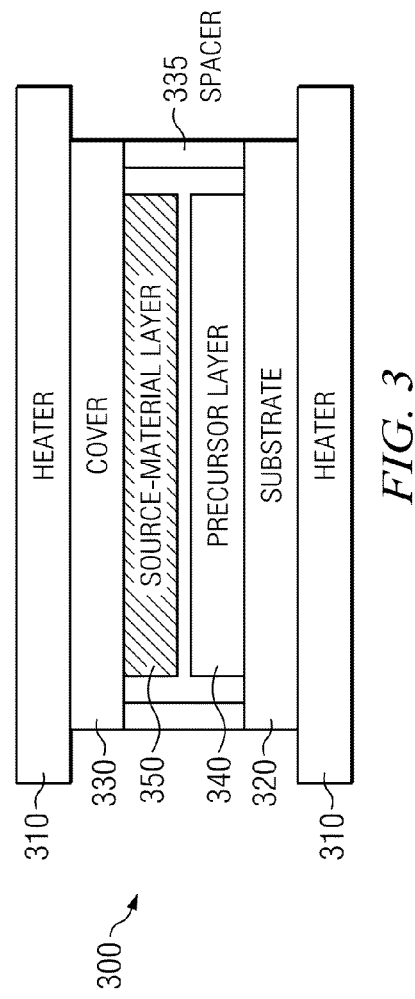
FIG. 3 illustrates an example closed-space annealing apparatus.

In particular embodiments, a chalcogenide film (e.g., CIGS or CZTS) may be manufactured by annealing the film in a constrained volume. FIG. 3 illustrates an example closed-space annealing apparatus 300. Apparatus 300 includes a heater 310, a substrate 320, a cover 330, spacers 335, a precursor layer 340, and a source-material layer 350. Heater 310 may be any suitable heating source. Heaters 310 may be in close proximity to substrate 320 and cover 330 (such as, for example, for static annealing), or heaters 310 may be offset from substrate 320 and cover 330 (such as, for example, if substrate/device stack transport is involved). Heater 310 can provide heat via conduction, convection, radiation, or any combination thereof. For example, heater 310 may be a box furnace, tube furnace, diffusion furnace, or belt furnace that provides heat via a combination of conduction, convection, and radiation. As another example, heater 310 may be a rapid-thermal-processing-type chamber that provides heat via high-intensity lamps that may allow the annealing process to occur at a rapid rate. Substrate 320 and cover 330 may be any suitable substrate capable of withstanding high temperatures and/or pressures. Substrate 320 and cover 330 may provide structural support for the film stack. For example, substrate 320 or cover 330 may be soda-lime glass, a metal sheet or foil (e.g., stainless steel, aluminum, tungsten), graphite, a semiconductor (e.g., Si, Ge, GaAs), a polymer, another suitable substrate, or any combination thereof. Precursor layer 340 may be any suitable chalcogenide material, such as, for example, the CZTS or CIGS materials described previously.

In particular embodiments, precursor layer 340 may comprise chalcogenide material with one or more volatile species. For example, a CZTS precursor layer 340 may comprise Cu, Zn, Sn, and one or more of S or Se, where the volatile species comprise Sn and one or more of S or Se. As another example, a CIGS precursor layer 340 may comprise Cu, one or more of In or Ga, and one or more of S or Se, where the volatile species comprise one or more of In, S, or Se. In particular embodiments, precursor layer 340 may comprise metallic material, where S or Se may later be deposited into the precursor layer 340 in order to make a suitable chalcogenide material. For example, precursor layer 340 may comprise Cu, Zn, and Sn, where S or Se may later be deposited into precursor layer 340 in order to make a suitable CZTS material. As another example, precursor layer 340 may comprise Cu and one or more of In or Ga, where S or Se may later be deposited into precursor layer 340 in order to make a suitable CIGS material. Precursor layer 340 may be deposited on substrate 320. Source-material layer 350 may be a film layer comprising the volatile species of the precursor layer 340. In particular embodiments, if the precursor layer 340 is a CZTS material, then source-material layer 350 may comprise Sn and one or more of S or Se. For example, source-material layer 350 may comprise 50% tin and 50% sulfur. As another example, source-material layer 350 may comprise 30-70% tin and 30-70% sulfur. As yet another example, source-material layer 350 may comprise 30-70% tin, 30-70% sulfur, and 30-70% selenium. As yet another example, source-material layer 350 may comprise Sn(S, Se), Cu(S, Se)$_2$, or any combination thereof. In particular embodiments, if the precursor layer 340 is a CIGS material, then source-material layer 350 may comprise one or more of Cu, In, or Ga, and one or more of S or Se. For example, source-material layer 350 may comprise approximately 30-70 atomic % In and Ga combined, and approximately 30-70 atomic % S and Se combined. As another example, source-material layer 350 may approximately 30-70 atomic % In and Ga combined, approximately 30-70 atomic % S, and approximately 30-70 atomic % Se. As yet another example, source-material layer 350 may comprise In$_2$S$_3$, In$_2$Se$_3$, Ga$_2$S$_3$, Ga$_2$Se$_3$, CuS, CuS$_2$, CuSe, CuSe$_2$, or any combination thereof. Source-material layer 350 may be any suitable thickness. In particular embodiments, source-material layer 350 may have a thickness of approximately 100 nm to approximately 5000 nm. For example, source-material layer 350 may have a thickness of 100 nm, 200 nm, 300 nm, 400 nm, 500 nm, 600 nm, 700 nm, 800 nm, 900 nm, or 1000 nm. In particular embodiments, source-material layer 350 may further comprise one or more alkali metals, which may be added to the source-material layer 350 to enhance grain growth or improve other electronic characteristics. For example, the source-material layer 350 may comprise up to approximately 10 atomic % of Li, Na, K, Rb, Cs, or any combination thereof. In particular embodiments, source-material layer 350 may be deposited on cover 330. In alternative embodiments, source-material layer 350 may be deposited onto precursor layer 340. Deposition of the source-material layer 350 may be performed using any suitable thin-film deposition process, such as, for example, chemical-vapor deposition, evaporation, atomic-layer deposition, sputtering, particle coating, spray pyrolysis, spin-coating, electro-deposition, electrochemical deposition, photoelectrochemical deposition, hot-injection, chemical-bath deposition, spin coating, another suitable deposition process, or any combination thereof. Apparatus 300 may be capable of performing high-pressure, high-temperature processes. The reaction conditions in apparatus 300 may be precisely controlled, monitored, and adjusted to optimize the reaction yield and sample uniformity. Apparatus 300 may be a closed-space annealing chamber that may partially or wholly contain decomposition products generated during annealing. Apparatus 300 may be a constrained volume, with minimal dead space in the reaction chamber. Apparatus 300 may also include perforations (such as, for example, in the heater 310, substrate 320, cover 330, or in another suitable location) to permit the flow of reactants, dopants, decomposition products, or by-products in to or out of apparatus 300, or to facilitate pressure control or equalization. Although FIG. 3 illustrates a particular arrangement of heater 310, substrate 320, cover 330, spacers 335, precursor layer 340, and source-material layer 350, this disclosure contemplates any suitable arrangement of heater 310, substrate 320, cover 330, spacers 335, precursor layer 340, and source-material layer 350. For example, apparatus 300 may include a flexible continuous web and/or a conveyer belt that carries the individual components into the reaction chamber. As another example, apparatus 300 may not include spacers 335. Moreover, although FIG. 3 illustrates a particular number of heaters 310, substrates 320, covers 330, spacers 335, precursor layers 340, and source-material layers 350, this disclosure contemplates any suitable number of heaters 310, substrates 320, covers 330, spacers 335, precursor layers 340, and source-material layers 350. For example, apparatus 300 may include multiple precursor layers 340 or source-material layers 350. As another example, apparatus 300 may utilize a bare cover 330 that is not coated with a source-material layer 350.

In particular embodiments, apparatus 300 may introduce a cover 330 into proximity with the precursor layer 340. Any suitable mechanism may be used to introduce cover 330 into proximity with precursor layer 340. For example, cover 330 may be manually placed onto a sheet coated with precursor layer 340, and these may then be manually inserted into the reaction chamber of a closed-space annealing apparatus (e.g., apparatus 300) such that precursor layer 340 and cover 350 are directly facing each other in the reaction chamber. In particular embodiments, precursor layer 340 and cover 330 may be separated from each other by a specified distance using spacers 335. For example, precursor layer 340 and cover 330 may be separated from each other by approximately 0.01 mm to approximately 5 mm. Furthermore, the surface of precursor layer 340 may be substantially parallel to cover 330. As another example, precursor layer 340 and cover 330 may be substantially in contact with each other. In particular embodiments, cover 330 may be introduced over precursor layer 350. For example, precursor layer 340 may be manually inserted into the reaction chamber of apparatus 300 such that precursor layer 340 is substantially lying in a horizontal position. Cover 330 may then be manually inserted into the reaction chamber of apparatus 300 such that cover 330 is also substantially lying in a horizontal position above precursor layer 340. In particular embodiments, the cover 330 may be coated with a source-material layer 350. The coated cover 330 may be introduced into proximity with the precursor layer 340. The source-material layer 350 may be separated from precursor layer 340 by a specified distance, or source-material layer 350 may be substantially in contact with precursor layer 340. In particular embodiments, the source-material layer 350 may be deposited onto precursor layer 340. Deposition of source-material layer 350 may be performed using any suitable thin-film deposition process, such as, for example, chemical-vapor deposition, evaporation, atomic-layer deposition, sputtering, particle coating, electro-deposition, another suitable deposition process, or any combination thereof. For example, a sheet coated with precursor layer 340 and source-material layer 350 (which is deposited over precursor layer 340) may be manually inserted into the reaction chamber of a closed-space annealing apparatus (e.g., apparatus 300). Although this disclosure describes introducing cover 330 over precursor layer 340 in a particular manner, this disclosure contemplates introducing cover 330 over precursor layer 340 in any suitable manner.

FIGS. 4A-4J illustrate example configurations of a closed-space annealing apparatus 300. The apparatuses 300 illustrated in FIGS. 4A-4J may include a moving belt 405, a thermal-spreading support 415, a substrate 320, a cover 330, spacers 335, a precursor layer 340, and a source-material layer 350. A moving belt 405 may be any suitable device for moving a device stack in to, out of, or through an annealing chamber. For example, in a belt-furnace annealing configuration, the stack and thermal-spreading support may lie on top of the moving belt 405, which transports the stack through the belt furnace. A thermal-spreading support 415 may be used to minimize temperature variations as the device stack traverses through various zones in the furnace. Additional thermal-spreading supports 415 may be on top of or below the device stack, or no thermal-spreading supports 415 may be used at all. For example, the substrate 320 may sit on a thermal-spreading support 415, or may sit directly on the moving belt 405. Alternatively, the order may be reversed and the cover 330 may rest on the thermal-spreading support 415, or may sit directly on the moving belt 405, and then the precursor layer 340 and the substrate 320 may be placed above the cover 330.

Figure 4A:
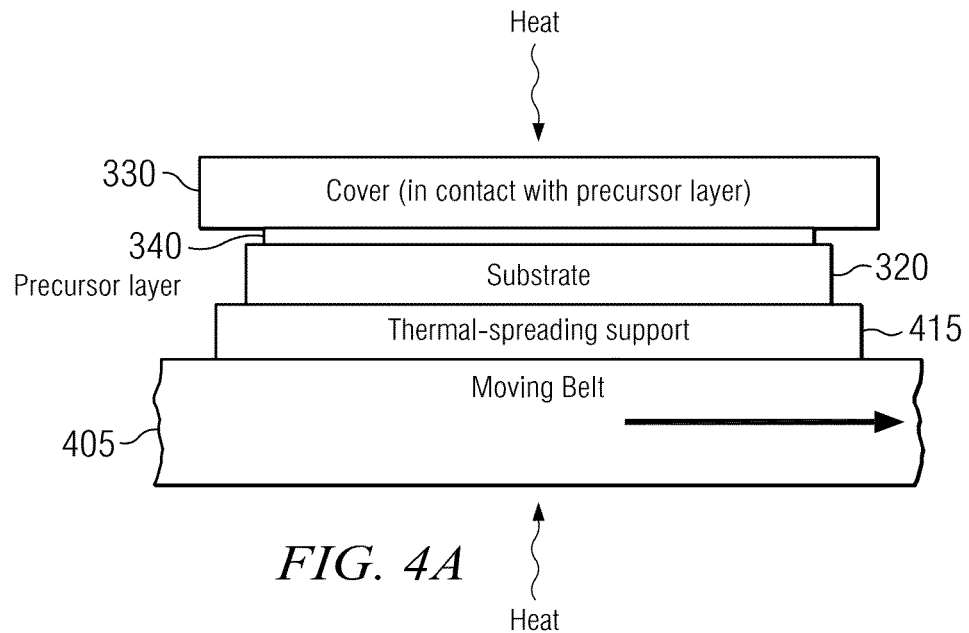
FIGS. 4A-4J illustrate example configurations of a closed-space annealing apparatus.

FIG. 4A illustrates an example configuration where the precursor layer 340 is annealed while substantially in contact with a cover 330. The cover 330 may create an overpressure of gaseous decomposition products from the precursor layer 340 that may reduce or suppress decomposition of the precursor layer 340. As used herein, the term overpressure means a partial pressure of a gaseous species that is sufficient to reduce or suppress decomposition of the species from the precursor layer 340, unless context suggests otherwise. For example, an overpressure of a gaseous species may be a partial pressure of the gaseous species that is equal to or greater than the equilibrium vapor pressure of that species. In particular embodiments, an oversized cover 330 may be used so that multiple cells may be processed simultaneously. The edges of the cover 330 may be shaped to control the flow of process gases past the sample being annealed and improve edge uniformity and homogeneity by influencing the inflow or outflow rates of gaseous species. The cover 330 may additionally be perforated to allow for gas inflow or outflow during processing. The size and density of these perforations may be optimized for the specific annealing process and the thermal responses of the various incoming and outgoing materials.

Figure 4B:
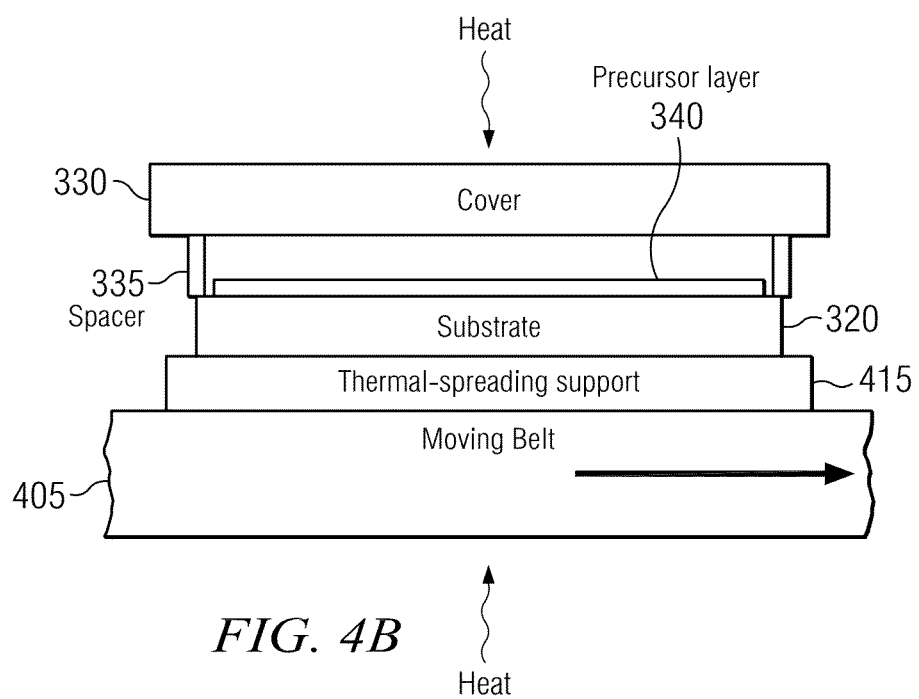

FIG. 4B illustrates an example configuration where the cover 330 is separated from the precursor layer 340 using spacers 335. The spacers 335 may be any suitable device for controlling the gap between the precursor layer 340 and the cover 330. For example, the spacers 335 may be made up of discrete elements, such as, blocks or inserts. As another example, the spacers 335 may be in the form of a gasket between the precursor layer 340 and the cover 330. As yet another example, the spacers 335 may be integrated into the cover 330 as protruding stands or legs. As yet another example, the spacers 335 may be a separate planar element that is substantially the same size as the precursor layer 340 or the cover 330. In particular embodiments, the spacers 335 may contain perforations or may be formed of a mesh to allow for gas inflow or outflow during processing. In particular embodiments, precursor layer 340 and cover 330 may be separated from each other by a specified distance using spacers 335. For example, precursor layer 340 and cover 330 may be separated from each other by approximately 0.01 mm to approximately 5 mm. The amount of volatile species escaping the precursor layer 340 may be managed by manipulating the size of the gap.

Figure 4D:
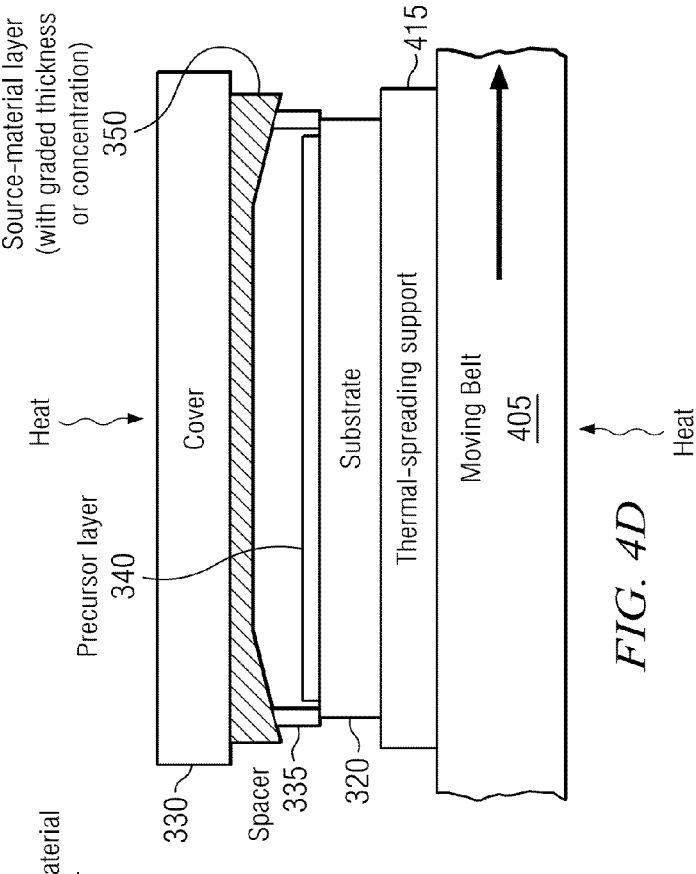
Figure 4C:
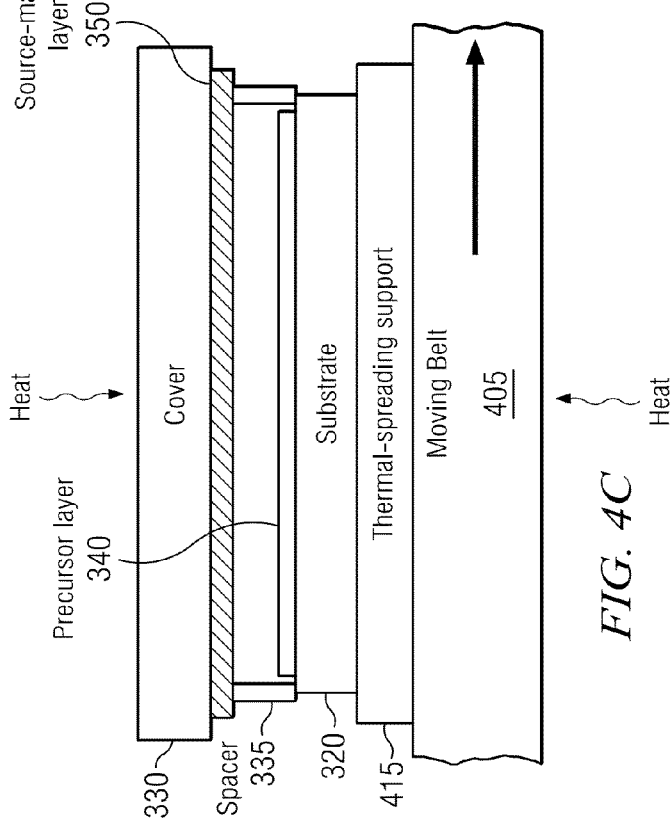

FIG. 4C illustrates an example configuration where the cover 330 is coated with a source-material layer 350. In particular embodiments, the source-material layer 350 may be separated from the precursor layer 340 by a specified distance using spacers 335. For example, precursor layer 340 and source-material layer 350 may be separated from each other by approximately 0.01 mm to approximately 5 mm. The amount of volatile species escaping the precursor layer 340 may be managed by manipulating the size of the gap. In alternative embodiments, the source-material layer 350 may be placed substantially in contact with the precursor layer 340. Coating the cover 330 with a source-material layer 350 may be done to reduce or suppress the decomposition of the precursor layer 340 chalcogenide film at high temperature by controlling the formation of decomposition products (e.g., gaseous $In(S, Se)$, $Sn(S, Se)$, $S_2$, $S_8$, $Se_2$) during the annealing process. For example, as the source-material layer 350 decomposes during annealing, it may create an overpressure of decomposition products over the precursor layer 340, which may reduce or suppress the decomposition of the precursor layer 340. Furthermore, the source-material layer 350 may be used to introduce reactants or dopants (such as, for example, Se, S, Sn, In, Na, or any combination thereof) during annealing.

Figure 4E:
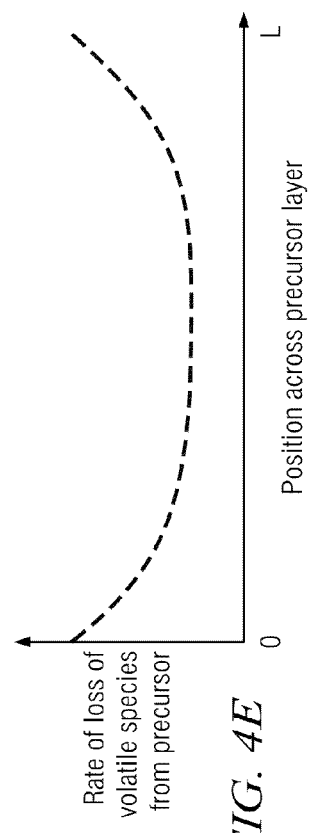

FIG. 4D illustrates an example configuration where the cover 330 is coated with a source-material layer 350 that has a graded thickness or concentration. Coating the cover 330 with a source-material layer 350 having a graded thickness or concentration may be done to compensate for the non-uniform decomposition of the precursor layer 340. For example, the precursor layer 340 may decompose more quickly at the periphery or edge of the film layer, as illustrated in FIG. 4E, which shows an example of the rate of loss of volatile species from the precursor layer 330 during annealing.

Figure 4G:
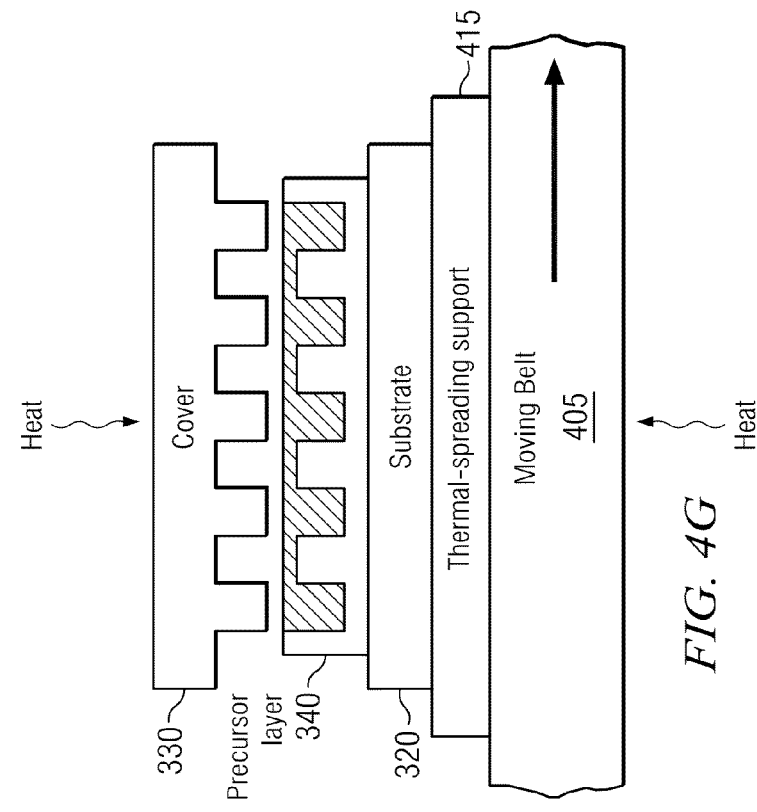
Figure 4F:
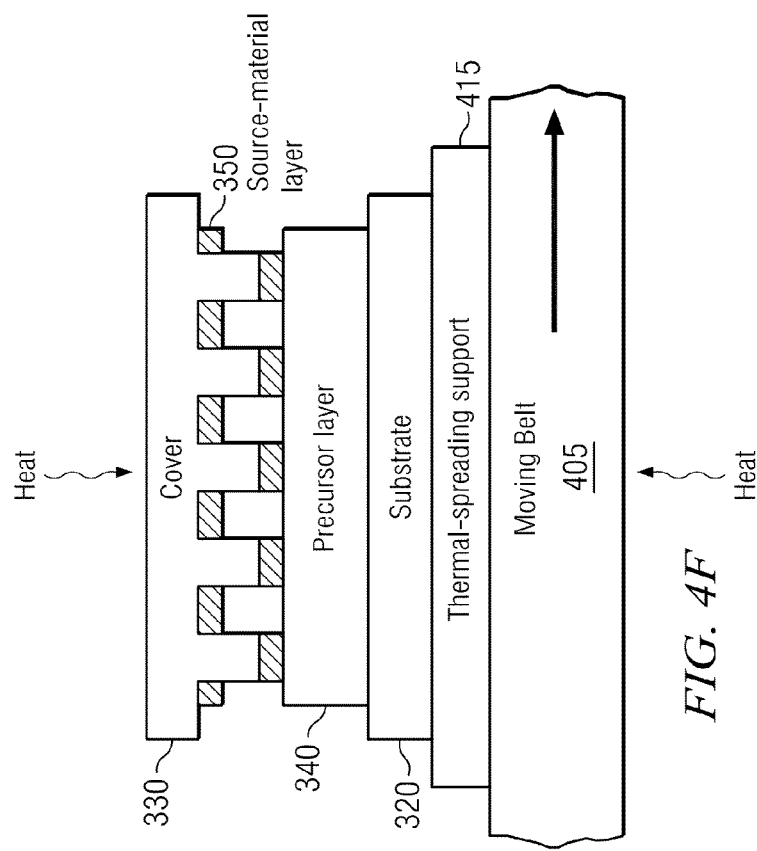

FIG. 4F illustrates an example configuration where the cover 330 comprises a patterned-substrate. A cover 330 with a patterned surface may then be coated with a source-material layer 350. In particular embodiments, the cover 330 may have a substantially smooth surface and the source-material layer 350 could be patterned independently during deposition. Coating the patterned-substrate with a source-material layer 350, or using a source-material layer 350 that is deposited in a pattern on a smooth substrate 330, may be done to facilitate the creation of a nano-structured compositionally graded thin-film. For example, the patterned source-material layer 350 may be used to generate alternating p-type and n-type semiconductor regions in the precursor layer 340 in a manner analogous to surface grating. In particular embodiments, some or all of the material from the patterned source-material layer 350 may be deposited onto the precursor layer 340 in a pattern corresponding to the patterned-substrate. For example, as the patterned source-material layer 350 decomposes during annealing, the gaseous species generated by the source-material layer 350 may be deposited in a corresponding pattern into the precursor layer 340, as illustrated in FIG. 4G. Alternatively, the patterned source-material layer 350 may create local regions over the precursor layer 340 where there is an overpressure of decomposition products, thereby reducing or suppressing the decomposition of the precursor layer 340 in a corresponding pattern. In particular embodiments, the patterned source-material layer 350 may be substantially in contact with the precursor layer 340 or even compressed during annealing. In particular embodiments, the configuration illustrated in FIG. 4F may be used multiple times on the same precursor layer 340. For example, a precursor layer 340 may be annealed multiple times in the presence of different patterned source-material layers 350 to generate a multi-layered variable or graded band-gap absorber.

Figure 4H:
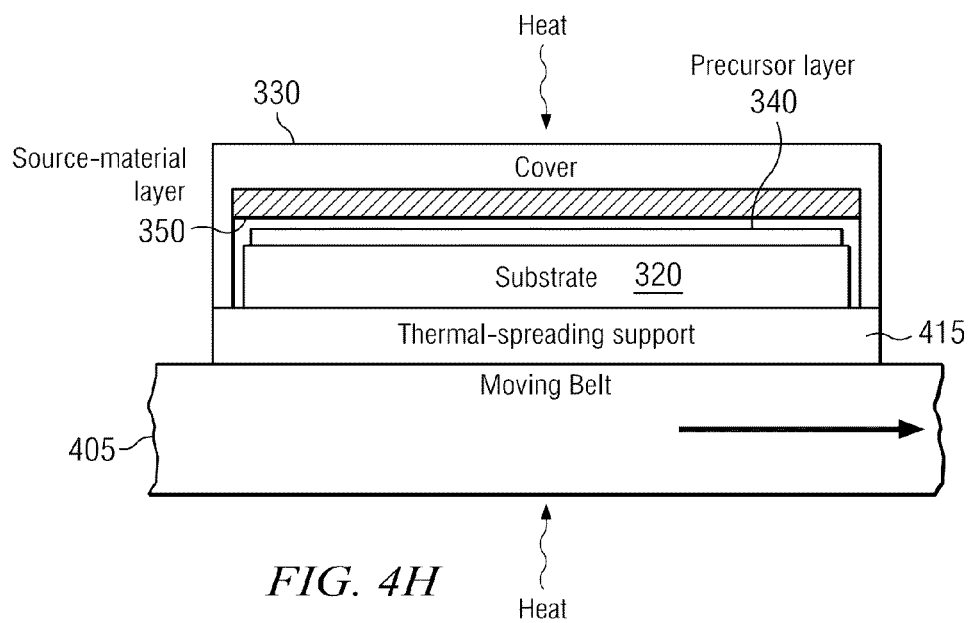
Figure 4I:
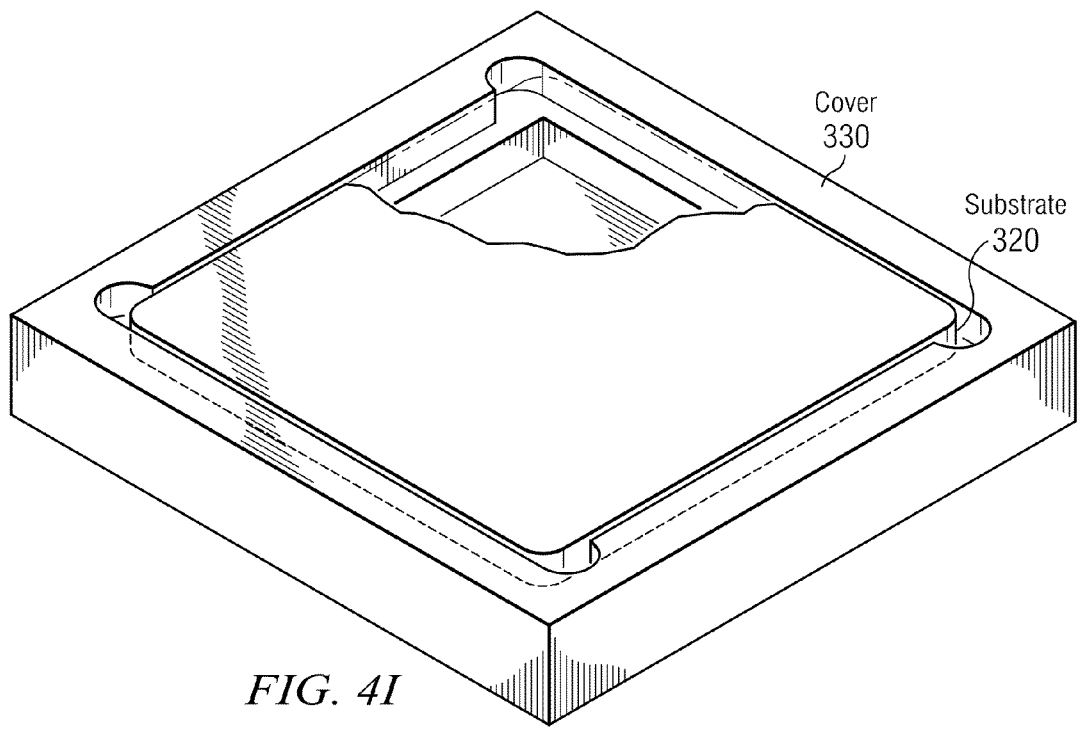

FIG. 4H illustrates an example configuration where the cover 330 encloses the precursor layer 340. In particular embodiments, the cover 330 may be coated with a source-material layer 350. A cover 330 that substantially encloses the precursor layer 340 may be used to create a constrained volume with respect to the precursor layer 340. During annealing, the volatile species in the precursor layer 340 may decompose at high temperatures and the cover 330 enclosing the precursor layer 340 may partially or wholly contain the decomposition products and cause an overpressure of the gaseous volatile species to form above the precursor layer 340, thereby reducing or suppressing the decomposition of the precursor layer 340. FIG. 4I illustrates an example cover 330 that may be used in the enclosure configuration illustrated in FIG. 4H. A substrate 320 coated with a precursor layer 340 may be placed into the cover 320 illustrated in FIG. 4I, which also includes notches that allow the substrate 320 to be easily inserted and removed from the cover 320. The cover 330 illustrated in FIG. 4I may also be coated with a source-material layer 350.

Figure 4J:
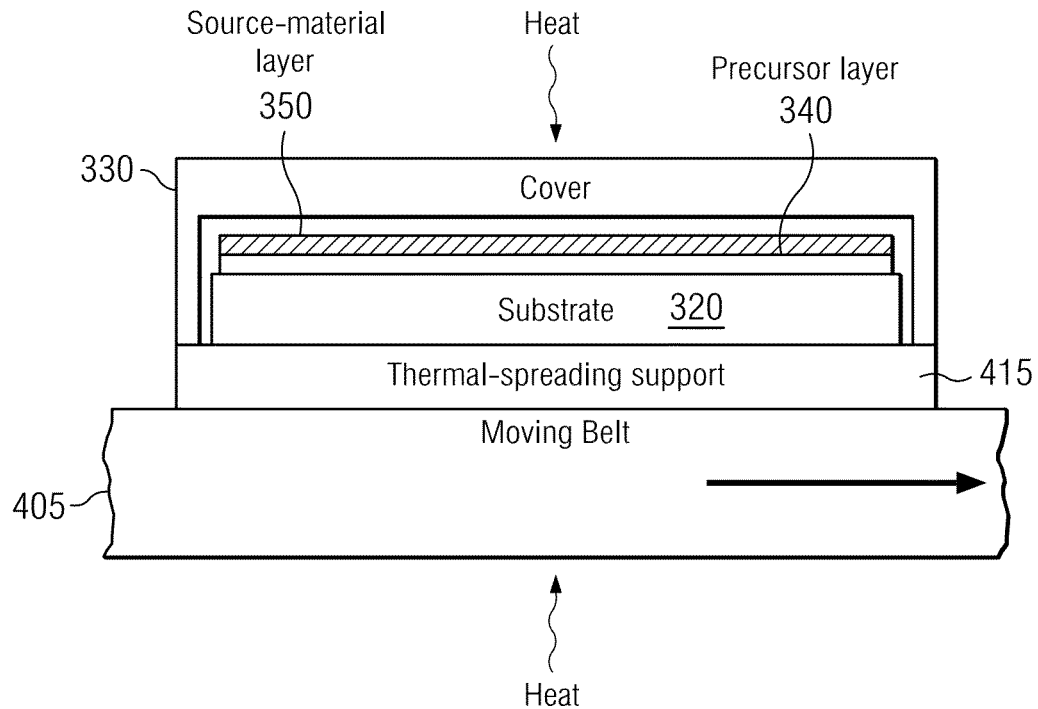

FIG. 4J illustrates an example configuration where the source-material layer 350 is deposited on the precursor layer 340 and functions as a capping layer. The presence of the capping layer may reduce or suppress decomposition of the volatile species from the precursor layer 340 during annealing. The capping layer may be used to effectively create a constrained volume with respect to the precursor layer 340 by acting as a barrier to prevent decomposition products from escaping from the precursor layer 340 during annealing. In particular embodiments, the capping layer may comprise one or more dopant materials and may be used to introduce one or more dopants into the precursor layer 340 by functioning as an in-contact source of the dopant materials. In particular embodiments, the capping layer may be designed to be removed and to ensure that it leaves no undesirable residue on the precursor layer 340.

Although FIGS. 4A-4J illustrate particular arrangements of moving belt 405, thermal-spreading support 415, substrate 320, cover 330, spacers 335, precursor layer 340, and source-material layer 350, this disclosure contemplates any suitable arrangement of moving belt 405, thermal-spreading support 415, substrate 320, cover 330, spacers 335, precursor layer 340, and source-material layer 350. For example, a neither a moving belt 405 nor a thermal-spreading support 415 need be used in any of the configurations illustrated or described herein. Moreover, although FIGS. 4A-4J illustrate a particular number of moving belts 405, thermal-spreading supports 415, substrates 320, covers 330, spacers 335, precursor layers 340, and source-material layers 350, this disclosure contemplates any suitable number of moving belts 405, thermal-spreading supports 415, substrates 320, covers 330, spacers 335, precursor layers 340, and source-material layers 350.

In particular embodiments, apparatus 300 may anneal precursor layer 340 in proximity with cover 330. The cover 330 may be coated with a source-material layer 350. In particular embodiments, introducing cover 330 into proximity with precursor layer 340 may create a constrained volume with respect to the precursor layer 340. For example, a cover 330 that substantially encloses precursor layer 340 may create a constrained volume. The annealing may be performed in a constrained volume under isochoric, isobaric, isothermal, or other suitable conditions. The annealing may be performed at any suitable pressure. For example, annealing may occur under vacuum, under partial vacuum, at atmospheric pressure, or with an overpressure of gas. During annealing, the volatile species in the precursor layer 340 (e.g., indium, tin, sulfur, selenium) may decompose at high temperatures. The constrained volume may reduce decomposition of the volatile species from precursor layer 340 during annealing by allowing a high concentration of decomposition products to form in the atmosphere above the precursor layer 340. In particular embodiments, apparatus 300 may anneal precursor layer 340 in proximity with source-material layer 350 (such as, for example, when cove 330 is coated with source-material layer 350). During annealing, the volatile species (e.g., indium, tin, sulfur, selenium) in source-material layer 350 may decompose at high temperatures, creating an atmosphere above the precursor layer 340 that has a high concentration of decomposition products. For example, a source-material layer 350 comprising Sn and one or more of S or Sn may create an atmosphere comprising SnS gas, SnSe gas, sulfur gas ($S_2$ or $S_8$), selenium gas, or any combination thereof. As another example, a source-material layer 350 comprising one or more of In, S, or Se may create an atmosphere comprising indium-sulfide gas, indium-selenide gas, sulfur gas ($S_2$ or $S_8$), selenium gas, or any combination thereof. As source-material layer 350 decomposes into gaseous components, the constrained volume in apparatus 300 may create an overpressure of the decomposition products. In particular embodiments, the chalcogenide film decomposition reaction may be further controlled by adding InS gas, InSe gas, SnS gas, SnSe gas, sulfur gas ($S_2$ or $S_8$), selenium gas, or any combination thereof to apparatus 300 to control the partial pressure of each gas. By maintaining relatively high partial pressures of these gases (using a cover 330, source-material layer 350, and/or by adding the gaseous decomposition products to apparatus 300), the decomposition of the volatile species from precursor layer 340 at high temperatures may be reduced or suppressed by shifting the equilibrium of the decomposition reaction of the chalcogenide film, such that it is slowed or even reversed. Thus, the chalcogenide precursor can be annealed at high temperature with little or no decomposition. In particular embodiments, other gaseous components may be added to apparatus 300 during annealing. For example, the atmosphere during annealing may comprise H, He, $N_2$, $O_2$, Ar, $H_2S$, Kr, $H_2Se$, Xe, another suitable gas, or any combination thereof. In particular embodiments, the total pressure of the gas atmosphere in apparatus 300 may range from, for example, $10^{-8}$ Pa to approximately $10^7$ Pa. In particular embodiments, apparatus 300 may heat precursor layer 340 to a first temperature of approximately 350° C. to approximately 700° C. during annealing. Heaters 210 may heat the system using any suitable type of heating, such as, for example, conduction, convection, radiation, or any combination thereof. For example, precursor layer 340 may be heated to a first temperature of 350° C., 360° C., 380° C., 400° C., 420° C., 440° C., 460° C., 480° C., 500° C., 520° C., 540° C., 560° C., 580° C., 600° C., 620° C., 640° C., 660° C., 680° C., or 700° C. Precursor layer 340 may then he held at the first temperature for 5 minutes to 120 minutes. Precursor layer 340 may then be cooled to a second temperature of approximately 20° C. to approximately 100° C. In particular embodiments, precursor layer 340 and cover 330/source-material layer 350 may be compressed during annealing. For example, precursor layer 340 and cover 330/source-material layer 350 may be placed substantially in contact with each other and then laterally compressed, such as, for example, by applying mechanical force via a weight, a vice, hydraulics, another suitable apparatus, or any combination thereof. In particular embodiments, precursor layer 340 may comprise chalcogenide material with a deficiency of volatile species, or only metallic components (such as, for example, Cu, Zn, and Sn for a CZTS film, or Cu and one or more of In or Ga for a CIGS film). One or more of the volatile species (e.g., In, Sn, S, Se) may then be deposited onto precursor layer 340 during annealing. For example, one or more of the volatile species may be deposited from source-material layer 350 onto precursor layer 340 during annealing. As source-material layer 350 is heated during annealing, source-material layer 350 may decompose to form gaseous forms of the volatile species, which may then be deposited onto precursor layer 340. Although this disclosure describes annealing precursor layer 340 in a particular manner, this disclosure contemplates annealing precursor layer 340 in any suitable manner.

FIGS. 5A-5D illustrate example configurations for arranging multiple samples in a closed-space annealing apparatus. The example configurations illustrated and described previously may be modified to allow the simultaneous processing of multiple samples in a variety of different configurations. For example, the multiple samples may be separated from each other by a specified distance using spacers 335. As another example, the multiple samples may be substantially in contact with each other, such as, for example, if they are stacked on top of each other. As yet another example, the multiple samples may be arranged or stacked in a cassette or enclosure.

FIG. 5A illustrates an example configuration where precursor-coated samples are placed with the precursor layers 340 facing each other. During annealing, as a first precursor layer 340 decomposes at high-temperature, it may effectively function as a source-material layer 350 for a second precursor layer 340 that is facing it, creating an overpressure of decomposition products over the second precursor layer 340, which may reduce or suppress the decomposition of the second precursor layer 340. Similarly, the second precursor layer 340 may have the same effect on the first precursor layer 340.

FIG. 5B illustrates an example configuration where precursor-coated samples are placed with the precursor layer 340 of a first sample facing the substrate 320 of an adjacent sample. During annealing, the substrate 320 of the adjacent sample may effectively function as a cover 330 with respect to the first sample. During annealing, the substrate 320 of the adjacent sample may create an overpressure of gaseous decomposition products from the first precursor layer 340, and may reduce or suppress decomposition of the first precursor layer 340. An uncoated cover 330 may be used for the final sample in the sequence.

FIG. 5C illustrates an example configuration where samples are coated with a precursor layer 340 on one side and a source-material layer 350 on the opposite side. This is effectively a variation of the configuration illustrated in FIG. 5B, where the substrate 320 from the adjacent sample is coated with a source-material layer 350. During annealing, the source-material layer 350 of the adjacent sample may decompose to generate an overpressure of gaseous decomposition products from the first precursor layer 340, and may reduce or suppress decomposition of the first precursor layer 340. A cover 330 coated with a source-material layer 350 may be used for the final sample in the sequence.

FIG. 5D illustrates an example configuration where samples are coated with a precursory layer 340, and the precursor layer 340 is coated with a source-material layer 350 that functions as a capping layer.

Although FIGS. 5A-5D illustrate particular arrangements of substrate 320, precursor layer 340, and source-material layer 350, this disclosure contemplates any suitable arrangement of substrate 320, precursor layer 340, and source-material layer 350.

FIG. 6 illustrates an example furnace for annealing. The methods and processes described herein may be performed in any suitable annealing chamber. The furnace illustrated in FIG. 6 is depicted as a multi-zone belt furnace, however, any suitable type of furnace may be used. The furnace may provide heat via conduction, convection, radiation, or any combination thereof. The furnace may include multiple heating zones, which may allow annealing temperature profiles to be optimized through the manipulation of heating zone set temperatures and belt speeds. For example, the annealing temperature profile may be optimized to avoid substrate-deformation that could occur due to thermal-expansion mismatches and related thermal phenomena. The furnace may also include a gas inlet (such as, for example, a multi-port gas injection system) for providing gaseous phase material (such as, for example, reactants, dopants, carrier gasses) to the annealing chamber. The furnace may also include a moving belt 405 for moving cells in to, out of, or through an annealing chamber.

Figure 7:
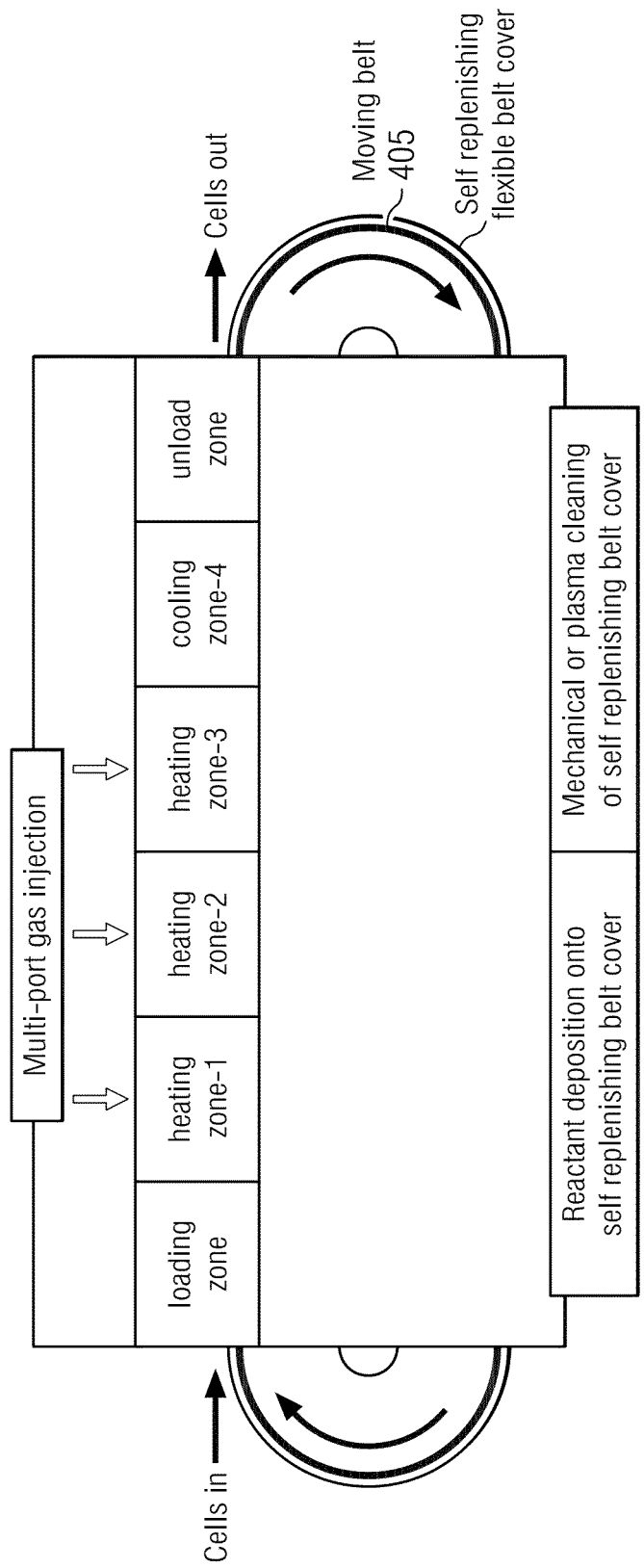
FIG. 7 illustrates an example furnace with a self-replenishing source-material layer.

FIG. 7 illustrates an example furnace with a self-replenishing source-material layer 350. This configuration may be used instead of using static covers 330. In this configuration, the moving belt 405 may effectively function as a cover 330. The moving belt 405 may be continually coated with a source-material layer 350. The replenished moving belt 405 enters the annealing chamber along with an incoming cell. A continuous moving belt 405 coated with a source-material layer 350 may be placed substantially in contact with a precursor-coated substrate 320 that is placed onto the moving belt 405. For example, the substrates 320 may be placed on the moving belt 405 with the precursor layer 340 side down. In the return loop the self-replenishing moving belt 405 may be cleaned and dried and then re-coated with a source-material layer 340. Cleaning of the moving belt 405 may be performed using solvent immersion, mechanical abrasion, plasma cleaning, another suitable cleaning method, or any combination thereof. Although FIG. 7 illustrates the moving belt 405 being coated with a source-material layer 350, any suitable continuous belt may be used. For example, the source-material layer 350 may be deposited onto an additional flexible substrate layer on top of the belt. As another example, the source-material layer 350 may be deposited onto a second loop that is independent of the moving belt.

Figure 8:
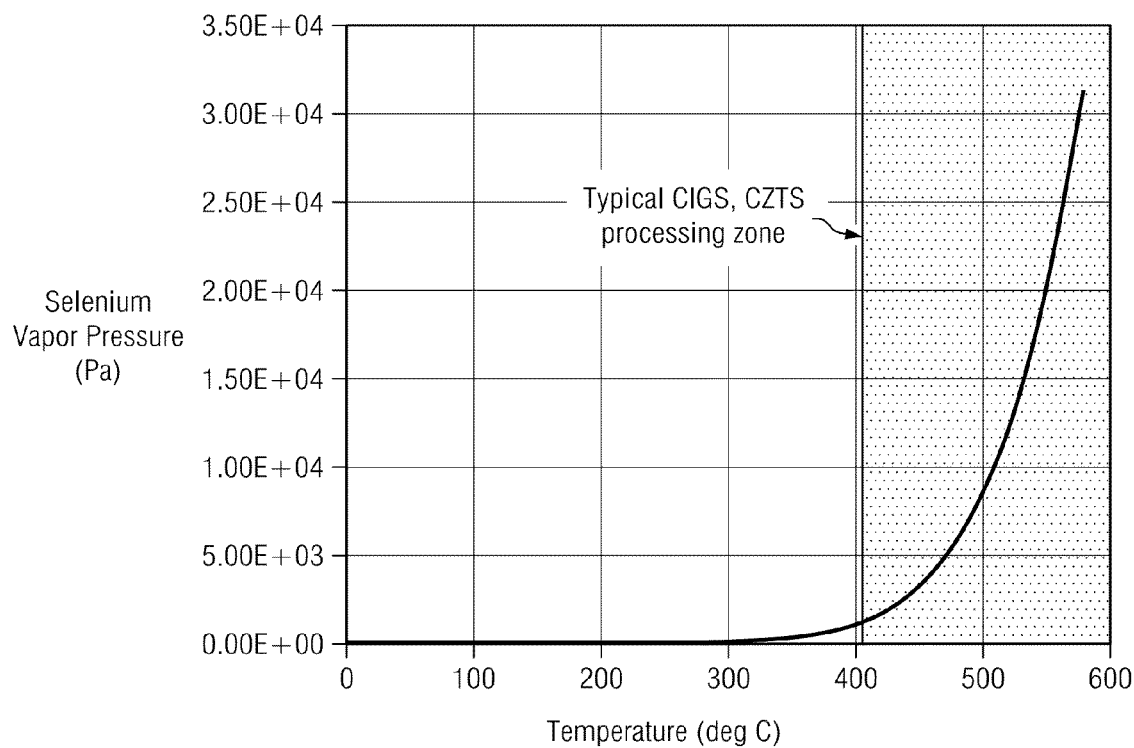
FIG. 8 illustrates the vapor pressure of selenium as a function of temperature.

FIG. 8 illustrates the equilibrium vapor pressure of selenium as a function of temperature. The vapor pressure of selenium rises rapidly at temperatures above 400° C., which is the temperature range commonly used during the annealing of chalcogenide films. Selenium in a chalcogenide film generally tends to vaporize from the film layer. Similar observations can be made about sulfur in a chalcogenide film. These species are an integral part of the annealing process as they help maintain the right stoichiometry and/or assist grain growth. Consequently, it is important to reduce or suppress the decomposition of chalcogenide films. This may be done by controlling the vaporization of these volatile species from the film layer, as described herein. Furthermore, it may be desirable to add these volatile species during the annealing process to compensate for any material that is lost to vaporization during annealing.

Figure 9:
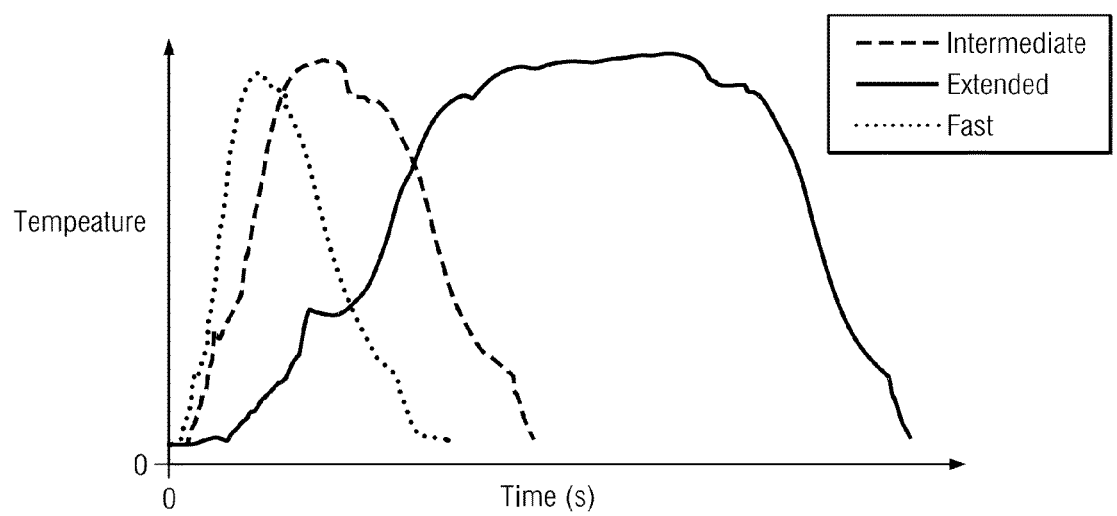
FIG. 9 illustrates example annealing temperature profiles in a belt furnace for various belt-speeds.

FIG. 9 illustrates example annealing temperature profiles in a belt furnace for various belt-speeds. The annealing temperature profile through a particular furnace can be manipulated by adjusting the belt speed. For example, ramping up and ramping down temperatures can be performed more quickly by having a fast belt speed. Although FIG. 9 illustrates and this disclosure describes particular annealing temperature profiles, this disclosure contemplates any suitable annealing temperature profile.

Figure 10A:
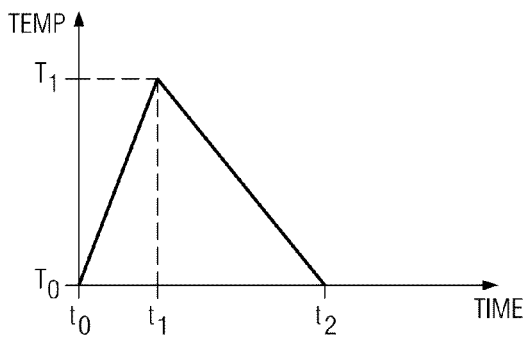
FIGS. 10A-10G illustrate example annealing temperature profiles.
Figure 10B:
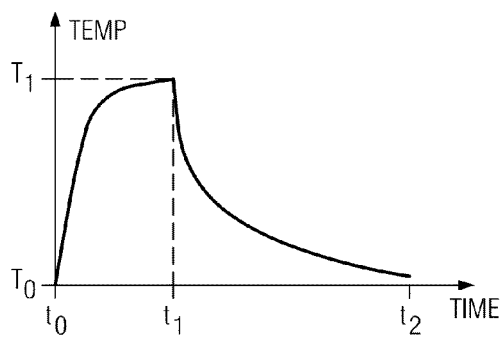
Figure 10C:
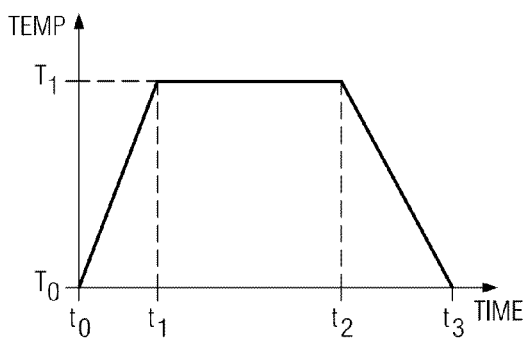
Figure 10D:
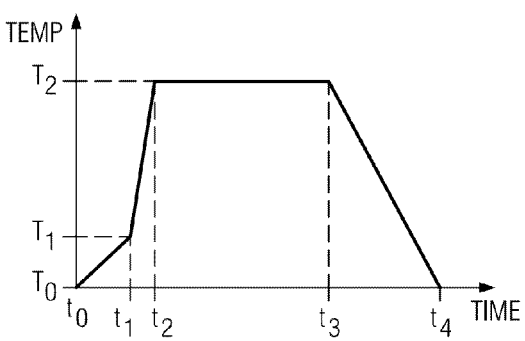
Figure 10E:
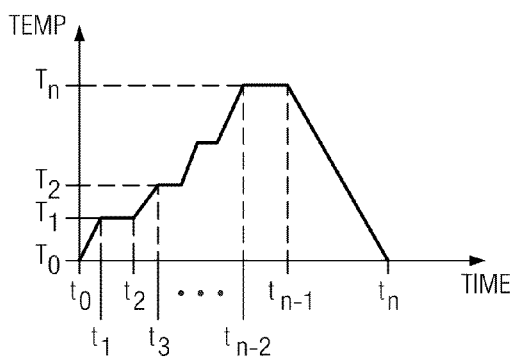
Figure 10F:
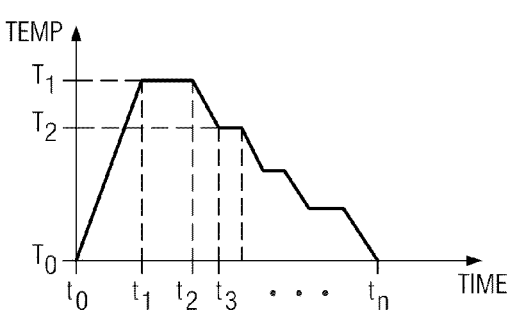
Figure 10G:
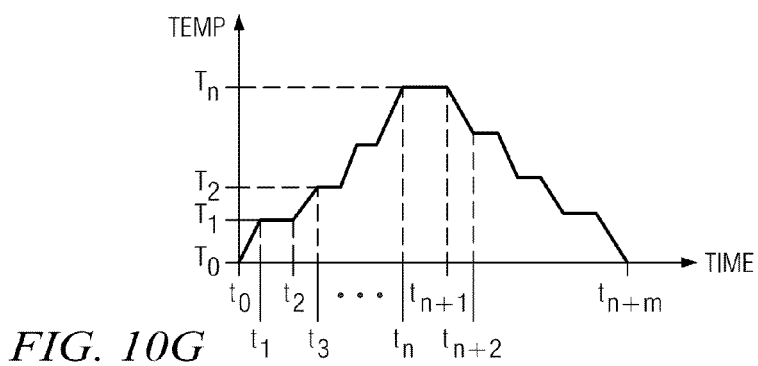

FIGS. 10A-10G illustrate example annealing temperature profiles. In particular embodiments, apparatus 300 may anneal a chalcogenide film layered structure by using pulsed annealing, flash annealing, laser annealing, furnace annealing, lamp annealing, another suitable annealing process, or any combination thereof. Annealing may be performed using a light source (e.g., a halogen lamp or a laser), resistive heaters, lasers, another suitable heating source, or any combination thereof. The heating may be effected either directly onto the surface of a film layer or via a back substrate. Annealing may be performed using single-stage or multi-stage processes. FIGS. 4A-4G illustrate example plots of temperature as a function of time (T=f(t)) during annealing of the layered structure. In FIG. 10A, the temperature of the layered structure is first increased from $T_0$ to $T_1$ at a temperature ramp rate (increase rate) of $(T_1-T_0)/(t_1-t_0)$, followed by a decrease to $T_0$ at a cooling rate of $(T_0-T_1)/(t_2-t_1)$. In FIG. 10B, the temperature of the layered structure is first increased from $T_0$ to $T_1$ at a ramp rate that decreases with increasing temperature, followed by a decrease to $T_0$ at a cooling rate at a cooling rate that is initially fast and decreases with decreasing temperature. In FIG. 10C, the temperature of the layered structure is first increased from $T_0$ to $T_1$ with a temperature ramp rate of $(T_1-T_0)/(t_1-t_0)$. The temperature of the layered structure is then held at approximately $T_1$ for a time $(t_2-t_1)$ before subsequently reducing the temperature to $T_0$ with a cooling rate of $(T_0-T_1)/(t_3-t_2)$. In FIG. 10D, the layered structure is first preheated to a temperature $T_1$ before increasing the temperature of the layered structure from $T_1$ to $T_2$ with a temperature ramp rate of $(T_2-T_1)/(t_2-t_1)$. The temperature of the layered structure is then held at approximately $T_2$ for a time $(t_3-t_2)$ before subsequently reducing the temperature to $T_0$ with a cooling rate of $(T_0-T_2)/(t_4-t_3)$. In FIG. 10E, the layered structure is annealed using a step-wise temperature profile, where the layer structure is first heated to $T_1$ with a ramp rate of $(T_1-T_0)/(t_1-t_0)$, held at approximately $T_1$ for a time $(t_2-t_1)$, then heated to $T_2$ with a ramp rate of $(T_2-T_1)/(t_3-t_2)$, held at approximately $T_2$ for a time $(t_4-t_3)$, and so on until a target temperature $T_n$ is reached. In FIG. 10F, the temperature of the layered structure is first increased from $T_0$ to $T_1$ with a temperature ramp rate of $(T_1-T_0)/(t_1-t_0)$, held at approximately T1 for a time $(t_2-t_1)$, followed by step-wise cooling where the layered structure is cooled to $T_2$ at a rate $(T_2-T_1)/(t_3-t_2)$, held at approximately $T_2$ for a time $(t_4-t_3)$, and so on until a target temperature $T_0$ is reached. In FIG. 10G, the layered structure is heated from $T_0$ to $T_n$ using the step-wise heating method described with reference to FIG. 10E, held at approximately $T_n$ for a time $(t_{n+1}-t_n)$, and then cooled to $T_0$ using the step-wise cooling method described with reference to FIG. 10F. Although FIGS. 10A-10G illustrates and this disclosure describes particular annealing temperature profiles, this disclosure contemplates any suitable annealing temperature profile.

Figure 11:
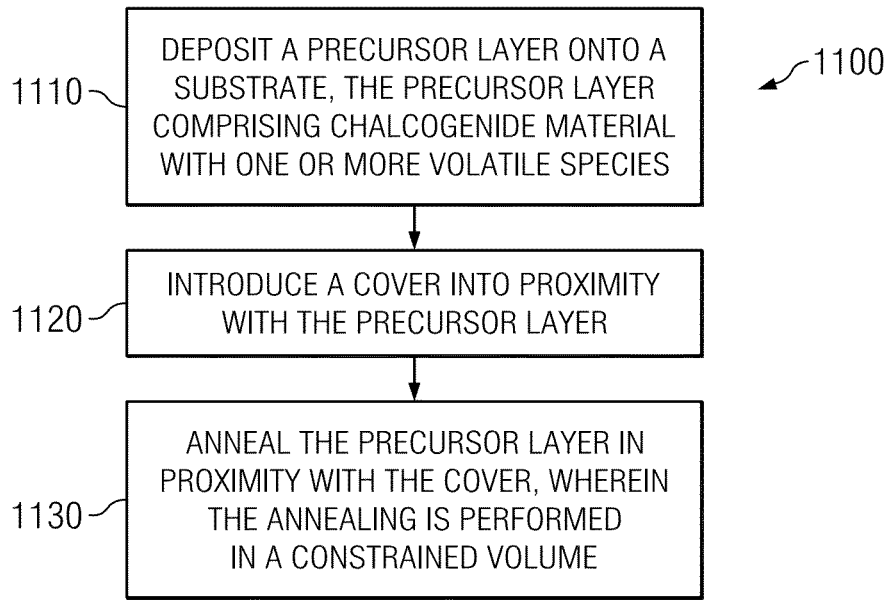
FIG. 11 illustrates an example method for producing a chalcogenide thin-film by annealing a precursor layer and a source-material layer in a constrained volume.

FIG. 11 illustrates an example method 1100 for producing a CZTS thin-film by annealing a precursor layer 340 and a cover 330 (which may or may not be coated with a source-material layer 350) in a constrained volume. The method may begin at step 1110, where precursor layer 340 is deposited onto substrate 320. Precursor layer 340 may comprise chalcogenide material with one or more volatile species. For example, precursor layer 340 may comprise Cu, Zn, Sn, and one or more of S or Se. As another example, precursor layer 340 may comprise Cu, one or more of In or Ga, and one or more of S or Se. At step 1120, cover 330 may be introduced over precursor layer 340. At step 1130, apparatus 300 may anneal precursor layer 340 in proximity with cover 330 Annealing may be performed in a constrained volume, where the presence of the cover 330 reduces decomposition of the volatile species from the precursor layer 330 during annealing. Particular embodiments may repeat one or more steps of the method of FIG. 11, where appropriate. Although this disclosure describes and illustrates particular steps of the method of FIG. 11 as occurring in a particular order, this disclosure contemplates any suitable steps of the method of FIG. 11 occurring in any suitable order. For example, method 1100 may be repeated multiple times with repeated deposition of precursor layers 340 to provide a multi-layered variable or graded band-gap absorber. Moreover, although this disclosure describes and illustrates particular components, devices, or systems carrying out particular steps of the method of FIG. 11, this disclosure contemplates any suitable combination of any suitable components, devices, or systems carrying out any suitable steps of the method of FIG. 11.

Figure 12:
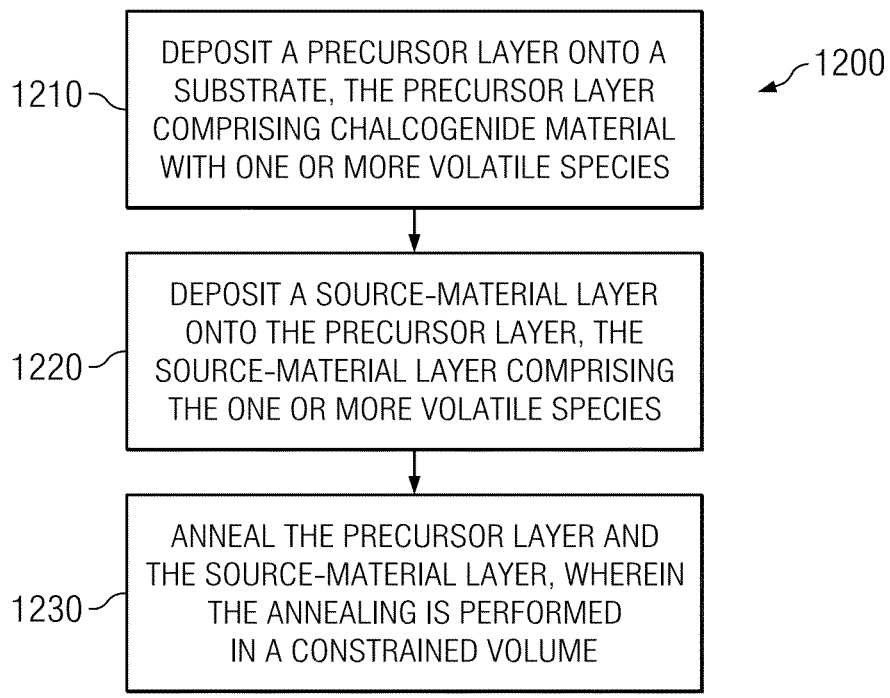
FIG. 12 illustrates an example method for producing a chalcogenide thin-film by depositing a source-material layer onto a precursor layer.

FIG. 12 illustrates an example method 1200 for producing a chalcogenide thin-film by depositing a source-material layer 350 onto a precursor layer 340. The method may begin at step 1210, where precursor layer 340 is deposited onto substrate 320. For example, precursor layer 340 may comprise Cu, Zn, Sn, and one or more of S or Se. As another example, precursor layer 340 may comprise Cu, one or more of In or Ga, and one or more of S or Se. At step 1220, source-material layer 350 may be deposited onto precursor layer 340. Source-material layer 350 may comprise the one or move volatile species. At step 1230, apparatus 300 may anneal precursor layer 340 and source-material layer 350 Annealing may be performed in a constrained volume. In particular embodiments, a cover 330 may be introduced into proximity with the source-material layer 350 during annealing, thereby creating a constrained volume. Particular embodiments may repeat one or more steps of the method of FIG. 12, where appropriate. Although this disclosure describes and illustrates particular steps of the method of FIG. 12 as occurring in a particular order, this disclosure contemplates any suitable steps of the method of FIG. 12 occurring in any suitable order. Moreover, although this disclosure describes and illustrates particular components, devices, or systems carrying out particular steps of the method of FIG. 12, this disclosure contemplates any suitable combination of any suitable components, devices, or systems carrying out any suitable steps of the method of FIG. 12.

Annealing Chalcogenide Layers with a Controlled Overpressure

Figure 13:
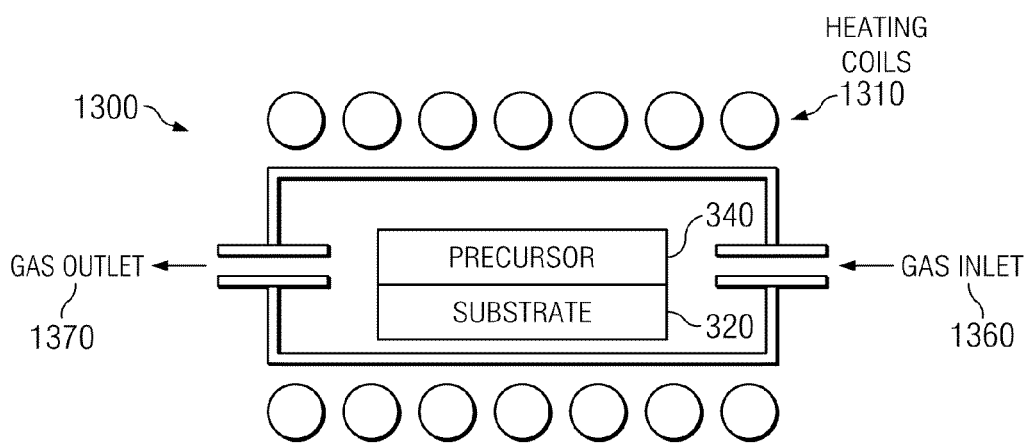
FIG. 13 illustrates an example tube-furnace apparatus.

In particular embodiments, a chalcogenide film may be manufactured by controlling the pressure of decomposition gasses formed during annealing. FIG. 13 illustrates an example tube-furnace apparatus 1300. Apparatus 1300 includes a heating coil 1310, a substrate 320, a precursor layer 340, a gas inlet 1360, and a gas outlet 1370. Heating coil 1310 may be any suitable heating source. Heater 1310 can provide heat via conduction, convection, radiation, or any combination thereof. For example, heater 1310 may be a belt furnace that provides heat via a combination of conduction, convection, and radiation. Gas inlet 1360 and gas outlet 1370 may comprise any suitable gas flow control elements. For example, gas inlet 1360 or gas outlet 1370 may include a conductance valve, control valve, a variable-speed pump, a pressure-relief valve, a mass-flow controller, a throttle valve, another suitable gas flow control element, or any combination thereof. Gas inlet 1360 and gas outlet 1370 may be used to provide a gaseous phase to apparatus 1300 and to control the pressure of the gaseous phase over time. The gaseous phase my comprise one or more of the decomposition products of the precursor layer 340, such as, for example, InS gas, InSe gas, SnS gas, SnSe gas, sulfur gas ($S_2$ or $S_8$), selenium gas, or any combination thereof. Gas inlet 1360 may be able to precisely control the partial pressure of each component of the gaseous phase. Gas inlet 1360 and gas outlet 1370 may also be used to provide a carrier gas to apparatus 1300. Apparatus 1300 may be capable of performing high-pressure, high-temperature processes. The reaction conditions in apparatus 1300 may be precisely controlled, monitored, and adjusted to optimize the reaction yield and sample uniformity. Apparatus 1300 may be a constrained volume, with minimal dead space in the reaction chamber. Although FIG. 13 illustrates a particular arrangement of heating coil 1310, substrate 320, precursor layer 340, gas inlet 1360, and gas outlet 1370, this disclosure contemplates any suitable arrangement of heating coil 1310, substrate 320, precursor layer 340, gas inlet 1360, and gas outlet 1370. For example, apparatus 1300 may include a flexible continuous web and/or a conveyor belt that carries the individual components into the tube furnace. Moreover, although FIG. 13 illustrates a particular number of heating coils 1310, substrates 320, precursor layers 340, gas inlets 1360, and gas outlet 1370, this disclosure contemplates any suitable number heating coils 1310, substrates 320, precursor layers 340, gas inlets 1360, and gas outlet 1370. For example, apparatus 1300 may include multiple gas inlets 1360 and gas outlets 1370, allowing for more precise spatial control of the partial pressure of each component of the gaseous phase.

In particular embodiments, apparatus 1300 may anneal precursor layer 340 in the presence of a gaseous phase. Apparatus 1300 may be used to anneal a chalcogenide film without decomposition of the crystalline chalcogenide phase. In particular embodiments, precursor layer 340 comprising chalcogenide material with one or more volatile species may be introduced into apparatus 1300. Gas outlet 1370 may then pull a full or partial vacuum in the tube-furnace. Gas outlet 1370 may then be closed, such as, for example, with a control valve, and gas inlet 1360 may then be used to provide a gaseous phase comprising one or more of the volatile species. For example, for a CZTS film, the gaseous phase may comprise Sn and one or more of S or Se. As another example, for a CIGS film, the gaseous phase may comprise one or more of In, S, or Se. Gas inlet 1360 may be used to create an overpressure of the decomposition products of the chalcogenide film, such as, for example, InS gas, InSe gas, SnS gas, SnSe gas, sulfur gas ($S_2$ or $S_8$), selenium gas, other sulfur compounds, other selenium compounds, or any combination thereof. Controlled quantities of each component of the gaseous phase can be introduced into the tube-furnace until a specified partial pressure of each component is reached. Gas inlet 1360 may then be closed and precursor layer 340 may then be annealed. The annealing may be performed in a constrained volume under isochoric, isobaric, isothermal, or other suitable conditions. The annealing may be performed at any suitable pressure. For example, annealing may occur under vacuum, under partial vacuum, at atmospheric pressure, or with an overpressure of gas. In particular embodiments, the partial pressure of a particular component of the gaseous phase may range from approximately 0 atm to approximately 10 atm. During annealing, gas inlet 1360 and gas outlet 1370 may be used to continuously control the partial pressure of each component of the gaseous phase by controlling the inlet and outlet gas flow rates. In particular embodiments, the partial pressure of each component of the gaseous phase may be kept approximately constant over substantially all of the surface of precursor layer 340. Minimizing concentration variations across the surface of precursor layer 340 during annealing may improve the properties or performance of precursor layer 340. In particular embodiments, the partial pressure of one or more components of the gaseous phase may be kept constant during substantially all of the annealing process. In alternative embodiments, the partial pressure of one or more components of the gaseous may vary over time during the annealing process, while still maintaining a partial pressure that is approximately spatially-constant over the surface of precursor layer 340. For example, the gaseous phase may initially have a partial pressure of $S_2$ gas of $p_0$, and the partial pressure may be ramped down to $p_1$ over time $(t_1-t_0)$ at a rate of $(p_1-p_0)/(t_1-t_0)$. By maintaining relatively high partial pressures of these gases, the decomposition of precursor layer 340 at high temperatures may be reduced or suppressed by shifting the equilibrium of the chalcogenide film decomposition reaction, such that it is slowed or even reversed. Thus, the chalcogenide precursor may be annealed at high temperature without any decomposition. In particular embodiments, the gaseous phase may also comprise a carrier gas to facilitate transport of the gaseous phase in apparatus 1300. The carrier gas may comprise H, He, $N_2$, $O_2$, Ar, $H_2S$, Kr, $H_2Se$, Xe, another suitable gas, or any combination thereof. In particular embodiments, the partial pressure of the carrier gas may range from approximately 0 atm to approximately 1 atm. In particular embodiments, apparatus 1300 may anneal according to one or more of the annealing temperature profiles described previously, such as, for example, an annealing temperature profile described with respect to apparatus 300 or illustrated in FIG. 10. In particular embodiments, precursor layer 340 may comprise metallic components, where one or more of S or Se may then be deposited onto precursor layer 340 during annealing. For example, one or more of S or Se may be deposited from the gaseous phase onto precursor layer 340 during annealing. As the gaseous phase is heated during annealing, gaseous sulfur or selenium from the gaseous phase may be deposited into precursor layer 340. Although this disclosure describes annealing precursor layer 340 in a particular manner, this disclosure contemplates annealing precursor layer 340 in any suitable manner.

Figure 14:
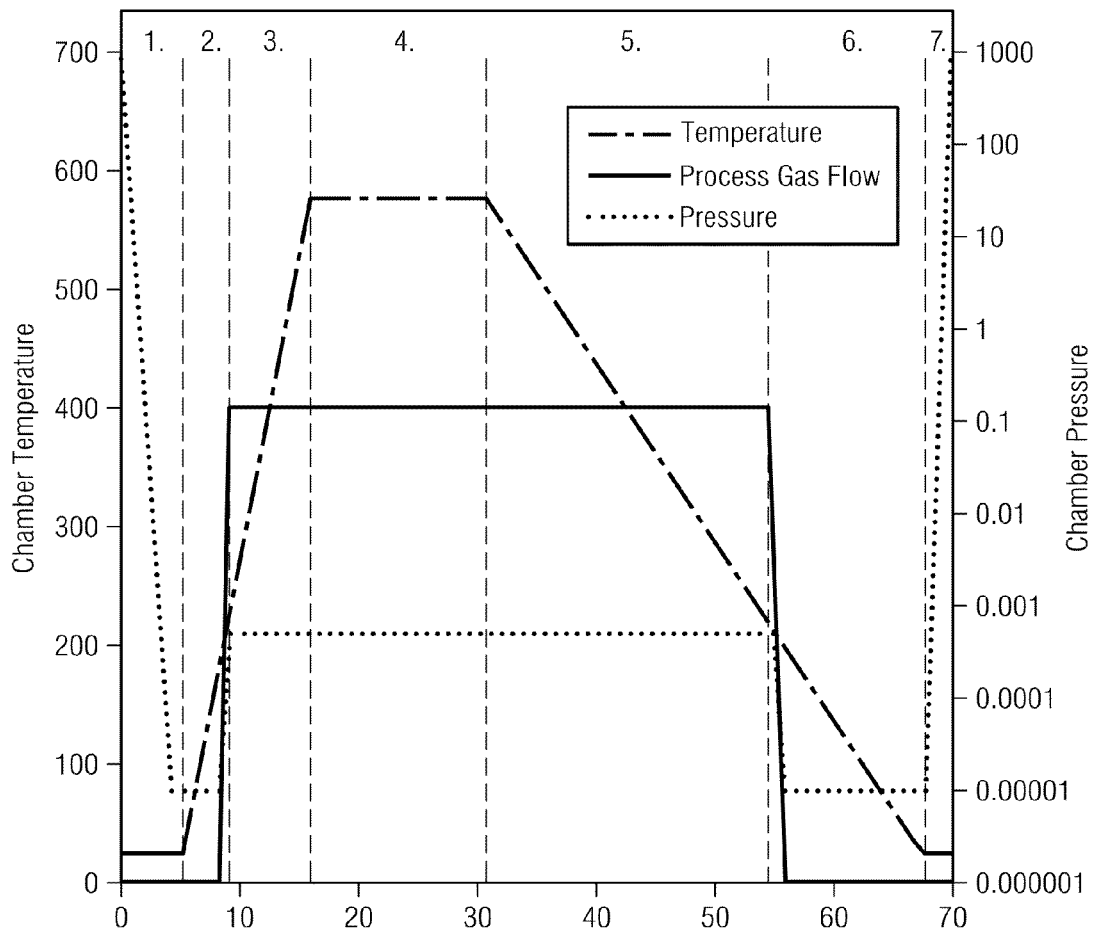
FIG. 14 illustrates an example process flow for annealing a chalcogenide thin-film.

FIG. 14 illustrates an example process flow for annealing a chalcogenide thin-film. Any suitable annealing chamber configuration may be used with this process flow. This annealing process may reduce or suppress the desorption of volatile species from a chalcogenide film (such as, for example, selenium or sulfur), and thus reduce or suppress the decomposition of the film layer normally caused by high-temperature annealing. At step 1, the pressure in the annealing chamber may be reduced to approximately 1 mTorr to 0.001 mTorr. This may remove any oxygen, organics, or other potential contaminants from the process chamber that might affect the chalcogenide crystallization anneal process and/or poison the chalcogenide thin-film when it is processed at high-temperatures. At step 2, the temperature of the precursor layer 340 may be ramped up at a rate of approximately 50° C./minute. At step 3, when the temperature of the precursor layer 340 is approximately 200° C., process gas may be introduced into the annealing chamber. The gas pressure may be increased to a level where a positive background pressure exits in the process chamber to prevent volatile species from desorbing from the chalcogenide film surface, which would prevent the proper chalcogenide crystallization process to occur. At step 4, the precursor layer 340 may be held at a "soak" temperature of approximately 350° C. to approximately 700° C. for approximately 5 minutes to approximately 120 minutes. Similarly, the pressure may be held during this period, where the partial pressure of each species of the gaseous phase may be between approximately 0.1 mTorr and 760 Torr. The core chalcogenide crystallization and anneal process occurs during this step. At step 5, the temperature of the precursor layer 340 may be cooled at a rate of approximately 50° C./minute to a temperature below approximately 200° C. Once the temperature of the precursor layer 340 drops below approximately 225° C. to approximately 175° C., the vapor pressure of volatile species in the chalcogenide film is low enough that decomposition of the precursor layer 340 has substantially stopped. At step 6, the chamber pressure may be reduced again to approximately 1 mTorr to 0.001 mTorr to evacuate any remaining gaseous species in preparation for opening the chamber. Finally, at step 7, when the precursor layer 340 has reached approximately room temperature (or an idle warm temperature), the annealing chamber may be vented to the atmosphere and the processed chalcogenide film may be removed from the chamber. Although FIG. 14 illustrates and this disclosure describes a particular annealing process, this disclosure contemplates any suitable annealing process.

Figure 15:
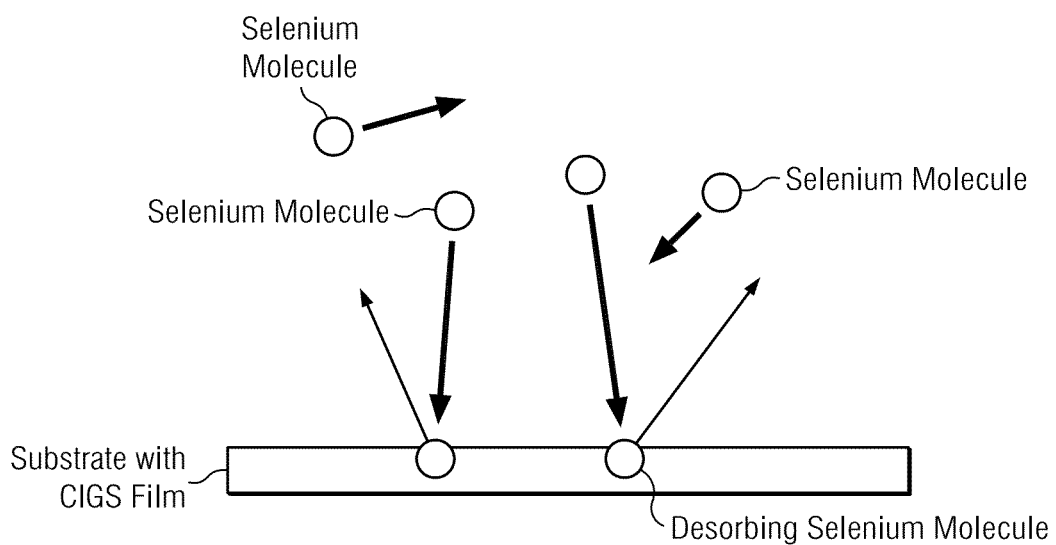
FIG. 15 illustrates an example of a chalcogenide thin-film during annealing.

FIG. 15 illustrates an example of a CIGS thin-film during annealing. At high-temperatures, selenium tends to desorb from the CIGS thin-film. However, by maintaining a relatively high partial pressure of gaseous selenium, the chemical equilibrium for the desorption of selenium from the precursor layer 340 may be shifted so that decomposition of the precursor layer 340 is reduced or suppressed. Furthermore, gaseous selenium above the precursor layer 340 may be adsorbed into the precursor layer 340. Similar concepts apply during the annealing of a CZTS thin-film or a sulfide-based chalcogenide thin-film.

Figure 16:
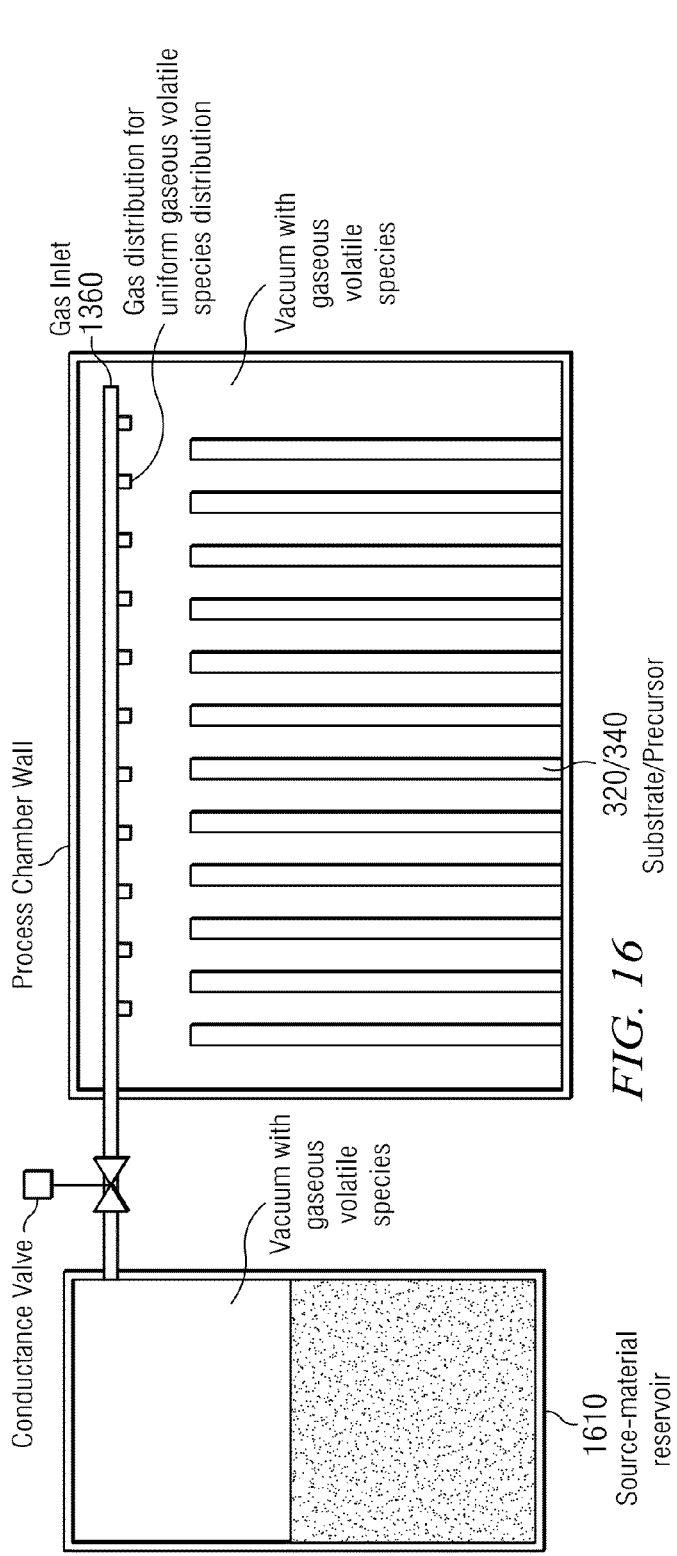
FIG. 16 illustrates an example diffusion furnace with multiple substrates loaded in a horizontal configuration.

FIG. 16 illustrates an example diffusion furnace with multiple substrates loaded in a horizontal configuration. In particular embodiments, a plurality of chalcogenide cells may be processed in a standard vertical or horizontal load configuration in a conventional diffusion or vacuum furnace. Cells can be arranged in any number of fixtures or chamber configurations in either the horizontal or vertical orientations. A furnace may include a source-material reservoir 1610, where reservoir material comprising the volatile species of the chalcogenide film may be stored for use during the annealing process. In particular embodiments, the temperature of the furnace walls may be kept approximately 5 degrees Celsius to approximately 50 degrees Celsius greater than a temperature of the precursor layer 340. This may cause the volatile species from the gaseous phase to preferentially deposits onto the precursor layer 340 compared to the furnace walls. Gaseous volatile species from the source-material reservoir 1610 may be introduced into the annealing chamber via a gas inlet 1360.

Figure 17:
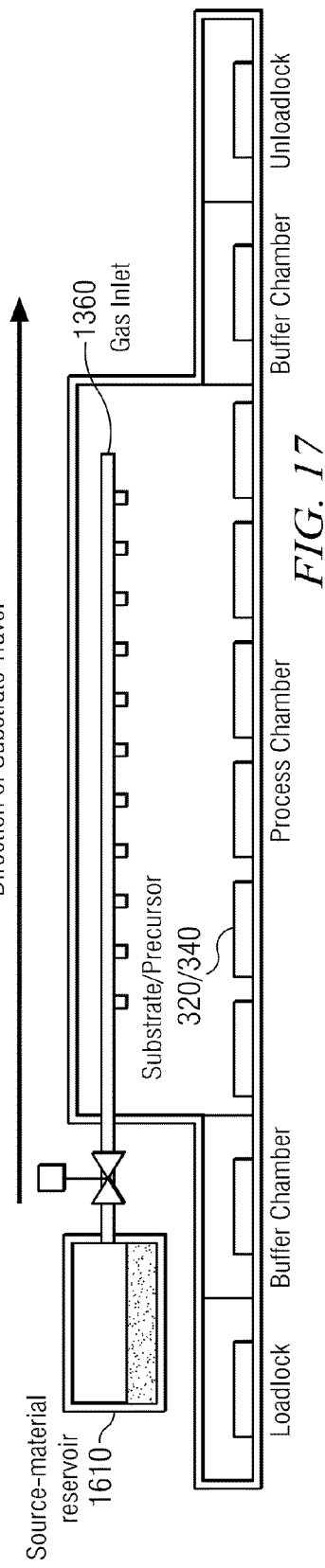
FIG. 17 illustrates an example conveyor-type furnace.

FIG. 17 illustrates an example conveyor-type furnace. In particular embodiments, cells (i.e., precursor-coated substrates) may be continuously processed using a conveyor-type furnace. For example, cells may enter the conveyor-type furnace through a series of load locks and intermediate vacuum buffer chambers. The cells may then be processed in sequence as they travel through the heating zone(s), and may exit the furnace through a sequence of buffer chambers and unload locks. During continuous processing, the cell temperature may be ramped up and down in a controlled manner that prevents cell breakage due to uneven stresses caused by temperature gradients across cell surfaces. In particular embodiments, gaseous volatile species from the source-material reservoir 1610 may be introduced into the annealing chamber via a gas inlet 1360.

Figure 18:
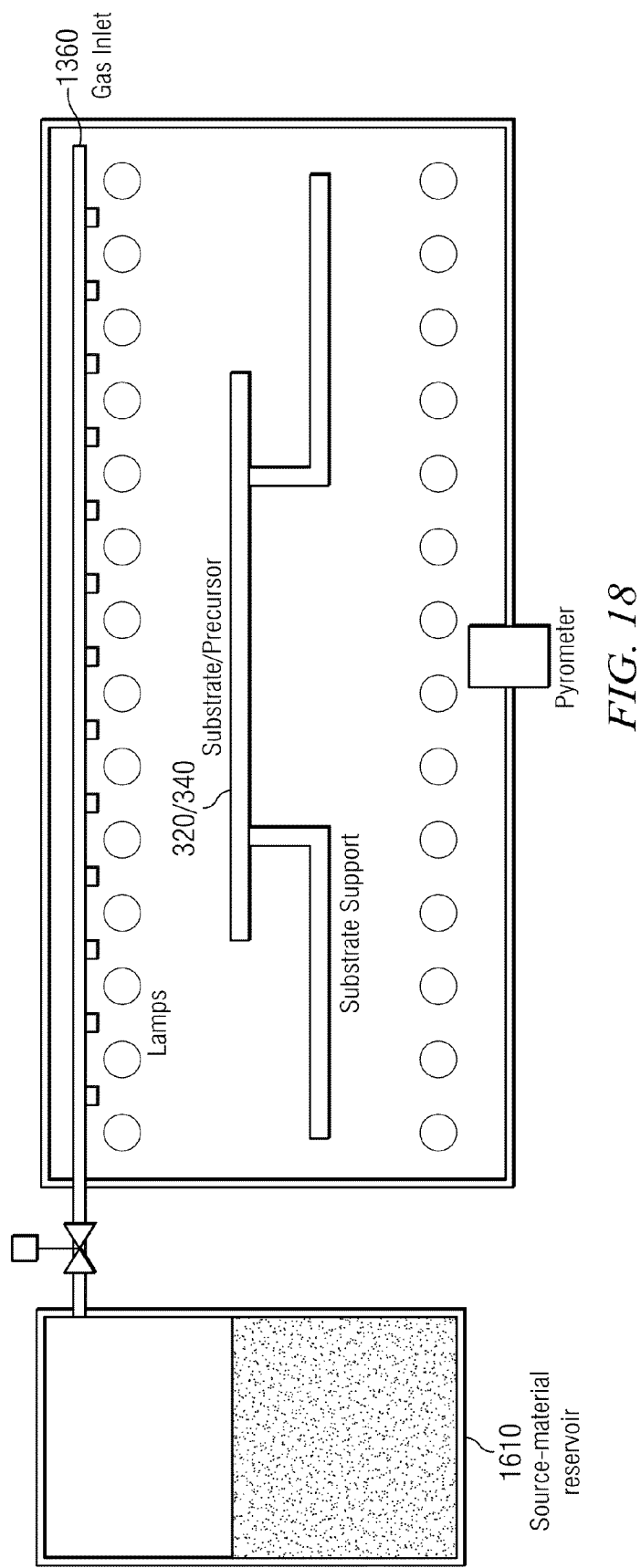
FIG. 18 illustrates an example rapid-thermal-processing furnace.

FIG. 18 illustrates an example rapid-thermal-processing (RTP) furnace. In particular embodiments, a cell may be loaded individually onto a substrate support and processed with high-intensity lamps that allow the chalcogenide crystalline annealing process to occur at a relatively rapid rate. For example, cycle times for an RTP-type process may be one to two orders of magnitude shorter than typical process times used in batch and continuous annealing processes. In particular embodiments, gaseous volatile species from the source-material reservoir 1610 may be introduced into the annealing chamber via a gas inlet 1360.

Figures 19, 20:
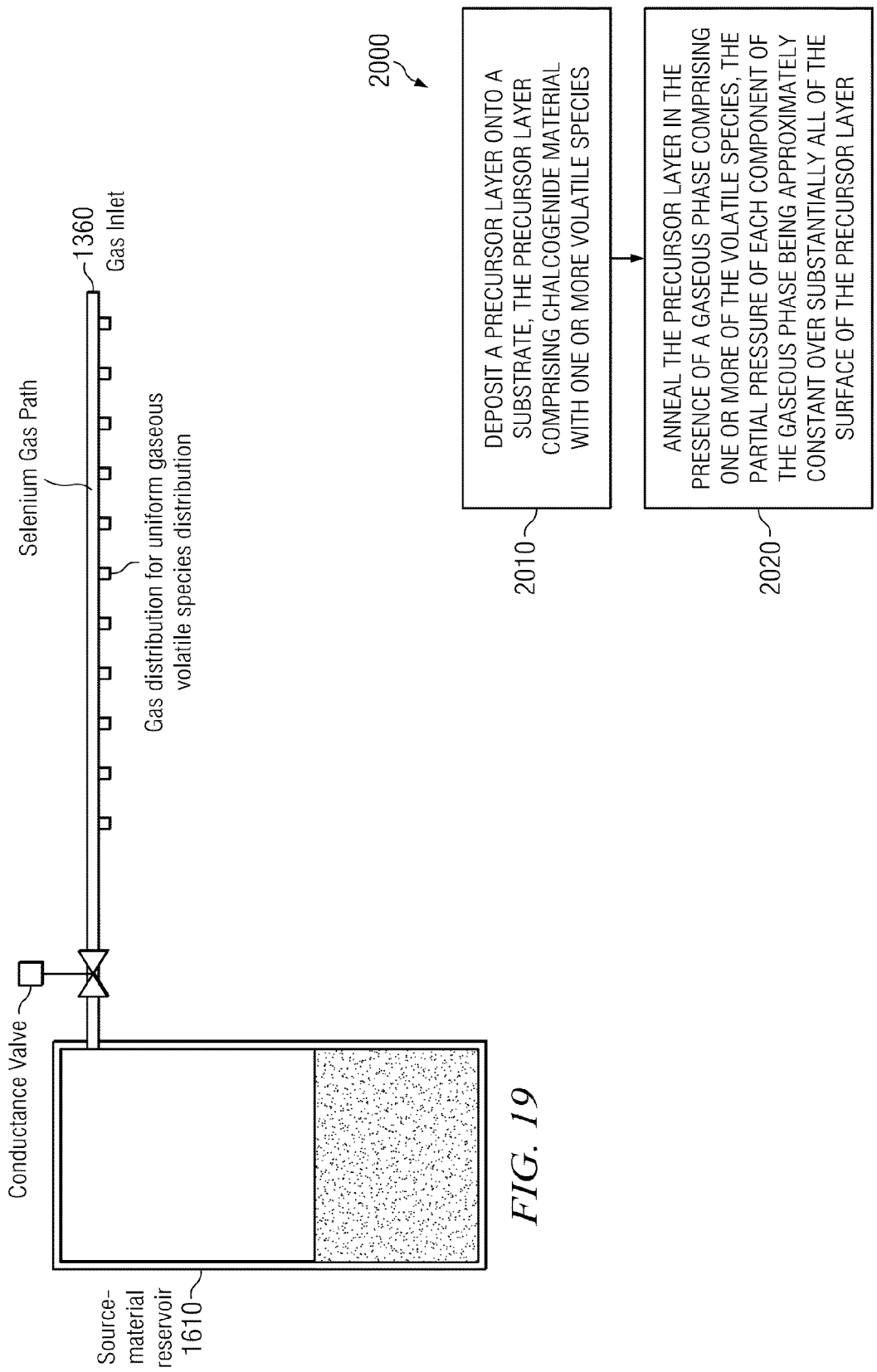
FIG. 19 illustrates an example for introducing a gaseous phase into an annealing apparatus.
FIG. 20 illustrates an example method for producing a chalcogenide thin-film using a controlled overpressure.

FIG. 19 illustrates an example apparatus for introducing gaseous phases into an annealing apparatus. In particular embodiments, the gas inlet 1360 for an annealing chamber may be connected to a source-material reservoir 1610. The source-material reservoir 1610 may include reservoir material and a heated gas-path between the reservoir and the gas inlet 1360. The reservoir material may be, for example, elemental sulfur, elemental selenium, sulfur compounds, selenium compounds, volatile dopants, or any combination thereof. In particular embodiments, simple evaporation/sublimation may be used to produce the gaseous volatile species. For example, source-material reservoir 1610 may heat the reservoir material until it vaporizes. The reservoir temperature may be kept greater than the melting point of the volatile species. For example, if the reservoir material comprises pellets of elemental selenium, the source-material reservoir 1610 may heat the pellets to a temperature greater than approximately 220° C., at which point the selenium will begin to melt and evaporate. In particular embodiments, gaseous volatile species from the source-material reservoir 1610 may be introduced into the annealing chamber via a gas inlet 1360. The flow rate of the gaseous species may be controlled using any suitable gas flow control elements. For example, the inflow rate of the gaseous volatile species may be controlled by changing the temperature of the reservoir material in the source-material reservoir 1610, and thereby changing the equilibrium vapor pressure of the reservoir material. As another example, the gas flow rate may be controlled using a conductance valve, a control valve, a variable-speed pump, a pressure-relief valve, a mass-flow controller, a throttle valve, another suitable gas flow control element, or any combination thereof. In particular embodiments, the apparatus illustrated in FIG. 19 may function as a uniform vapor distribution system. The uniform vapor distribution system may allow the partial pressure of each component of the gaseous phase in the annealing chamber to be kept approximately constant over substantially all of the surface of the precursor layer. The uniform vapor distribution system may include a heated gas path that prevents condensation of the volatile species from the gaseous phase. For example, because gaseous Se may condense at high pressure, the gas path may be heated to prevent material condensation and hence restriction or complete blockage of vapor flow to the process chamber. In particular embodiments, the gas inlet 1360 may also be used to introduce other process gasses, such as reactants, dopants, or carrier gasses into the annealing chamber.

FIG. 20 illustrates an example method 2000 for producing a chalcogenide thin-film using a controlled overpressure. The method may begin at step 2010, where precursor layer 340 is deposited onto substrate 320. Precursor layer 340 may comprise chalcogenide material with one or more volatile species. For example, precursor layer 340 may comprise Cu, Zn, Sn, and one or more of S or Se. As another example, precursor layer 340 may comprise Cu, one or more of In or Ga, and one or more of S or Se. At step 2020, precursor layer 340 may be annealed in the presence of a gaseous phase comprising one or more of the volatile species. For example, the gaseous phase may comprise Sn and one or more of S or Se if a CZTS film layer is being annealed. As another example, the gaseous phase may comprise one or more of In, S, or Se if a CIGS film layer is being annealed. The partial pressure of each component of the gaseous phase may be approximately constant over substantially all of the surface of precursor layer 340 for substantially all of the duration of annealing. Annealing may be performed in a constrained volume. Particular embodiments may repeat one or more steps of the method of FIG. 20, where appropriate. Although this disclosure describes and illustrates particular steps of the method of FIG. 20 as occurring in a particular order, this disclosure contemplates any suitable steps of the method of FIG. 20 occurring in any suitable order. Moreover, although this disclosure describes and illustrates particular components, devices, or systems carrying out particular steps of the method of FIG. 20, this disclosure contemplates any suitable combination of any suitable components, devices, or systems carrying out any suitable steps of the method of FIG. 20.

Properties of CZTS Materials

The properties of CZTS thin-films manufactured using some of the disclosed embodiments are described below and illustrated in FIGS. 21-25.

Figure 21:
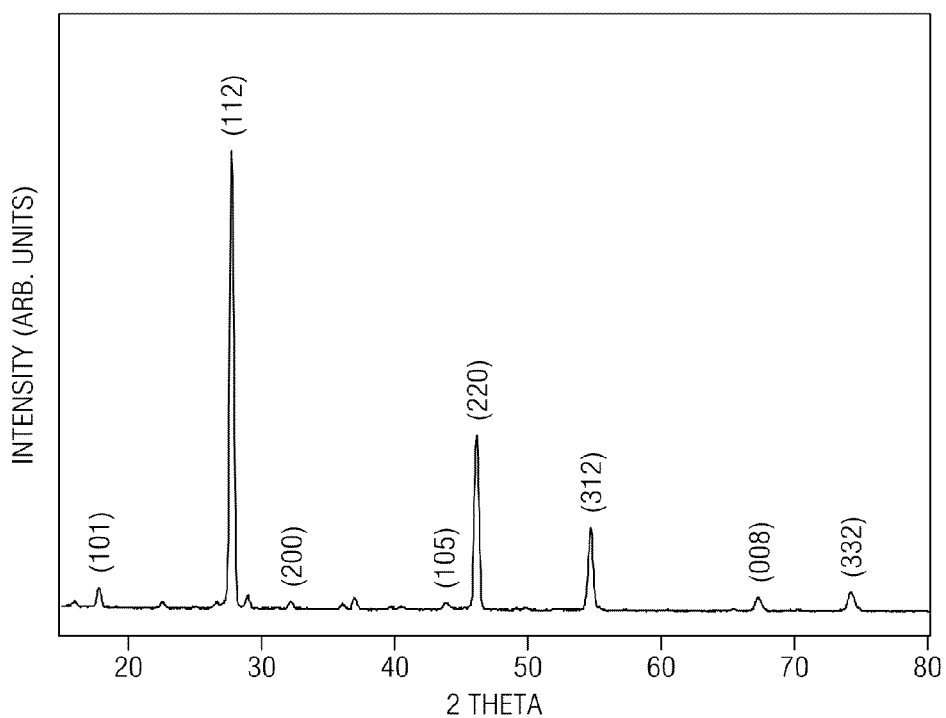
FIG. 21 illustrates an x-ray diffraction pattern of a CZTS thin-film.

FIG. 21 illustrates an x-ray diffraction pattern of a CZTS thin-film. The diffraction pattern shows the primary peaks for CZTS and can be used to establish that the film has the correct crystal structure.

Figure 22:
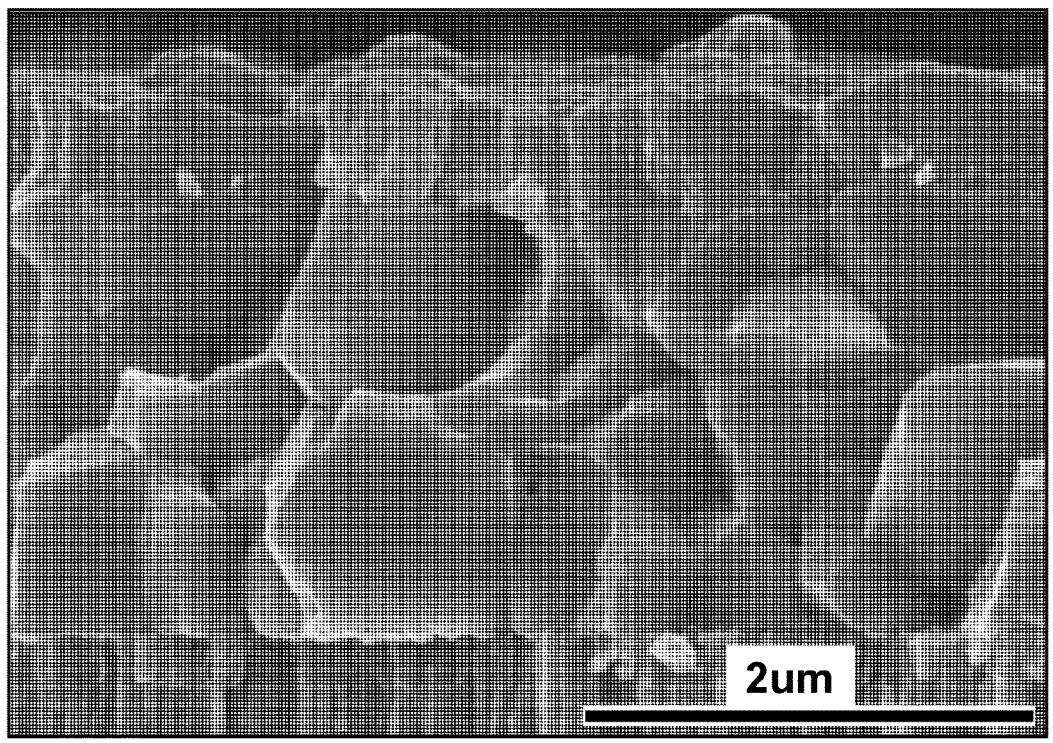
FIG. 22 illustrates a scanning electron microscopy image of a CZTS thin-film.

FIG. 22 illustrates a scanning electron microscopy image of a CZTS thin-film. The SEM image shows that the CZTS thin-film has relatively large grains and minimal defects (e.g., cracks, pores).

Figure 23:
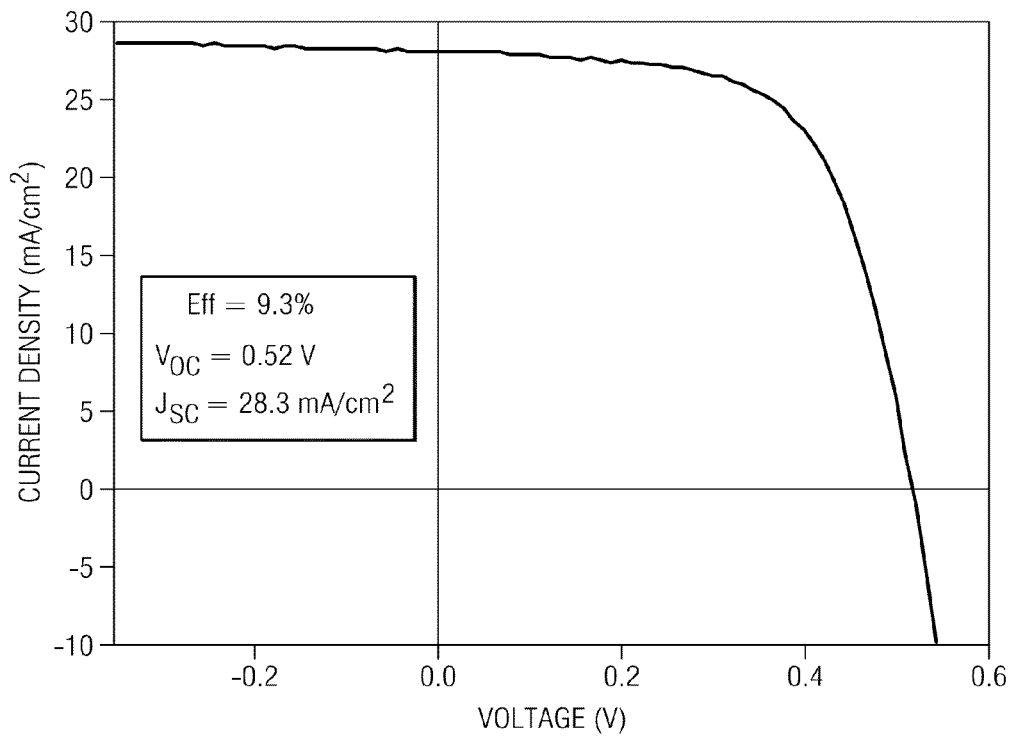
FIG. 23 illustrates a current-voltage measurement of a CZTS-based photovoltaic cell.

FIG. 23 illustrates a current-voltage measurement of a CZTS-based photovoltaic cell.

Figure 24:
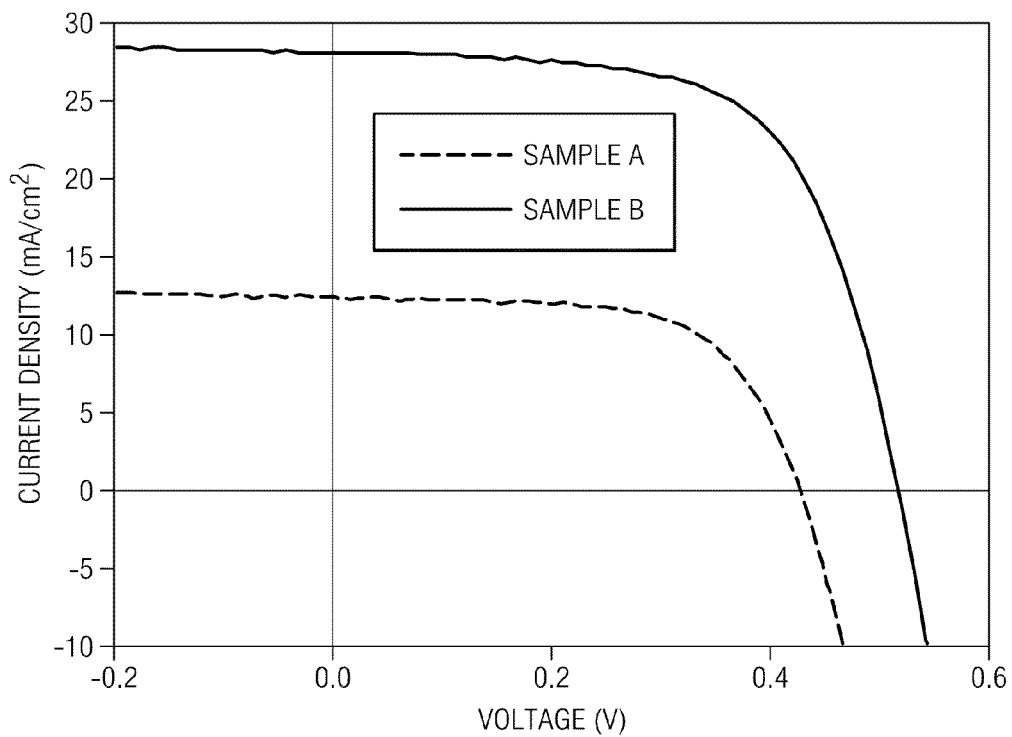
FIG. 24 illustrates current-voltage measurements of various CZTS thin-films.

FIG. 24 illustrates current-voltage measurements of various CZTS thin-films. Sample A was deposited at high temperature and Sample B was deposited at room temperature and annealed using the annealing processes described previously. Sample A was observed to be tin poor due to loss of tin sulfide and had considerably reduced efficiency.

Figure 25:
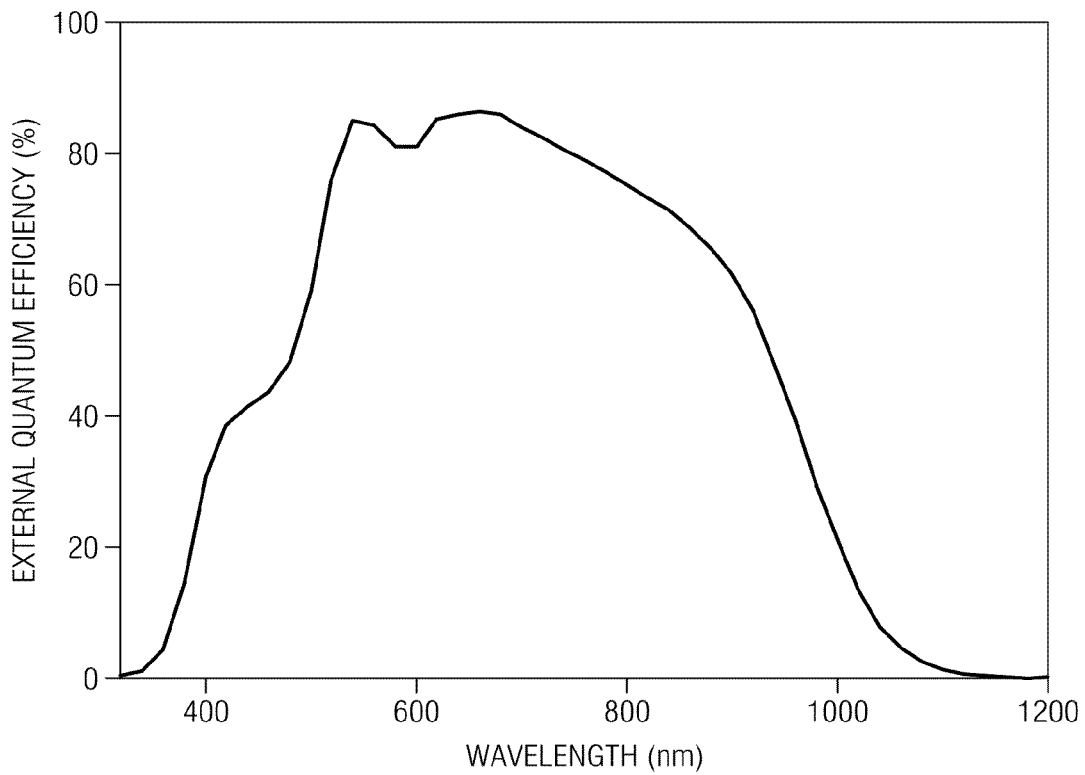
FIG. 25 illustrates an external quantum efficiency measurement of a CZTS-based photovoltaic cell.

FIG. 25 illustrates an external quantum efficiency measurement of a CZTS-based photovoltaic cell. The best efficiency achieved using this methodology was 9.3%, which is either comparable with or, in most cases, exceeds what is possible with other deposition and annealing methods.

Chalcogenide Thin-Film Device Stacks

Figure 26:
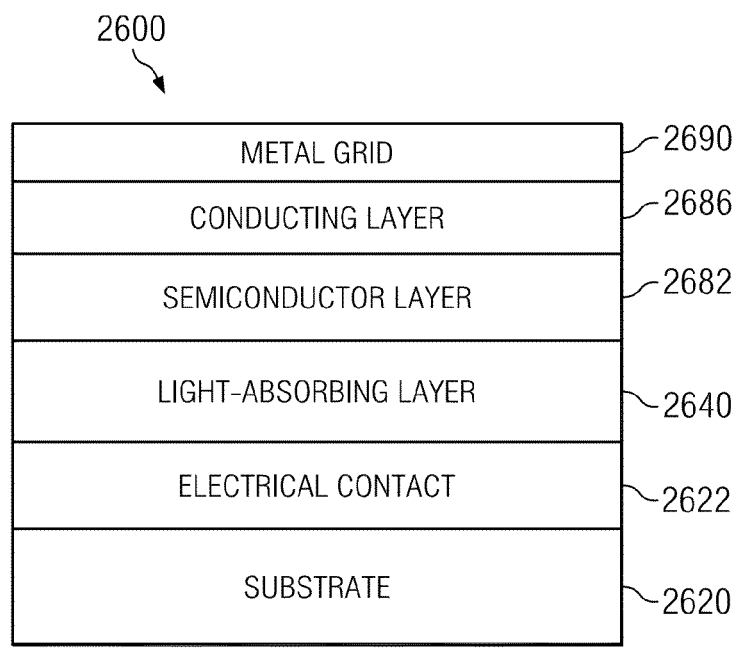
FIG. 26 illustrates an example chalcogenide thin-film device stack.

FIG. 26 illustrates an example chalcogenide thin-film device stack 2600. CZTS or CIGS film layers produced by one of the methods described previously may be incorporated into the example device structure illustrated in FIG. 26. Device stack 2600 includes a substrate 2620, an electrical contact 2622, a light-absorbing layer 2640, a semiconductor layer 2682, a conducting layer 2686, and a metal grid 2690. One or more layers of device stack 2600 may be deposited using one or more of chemical-vapor deposition, evaporation, atomic-layer deposition, sputtering, particle coating, spray pyrolysis, spin-coating, electro-deposition, electrochemical deposition, photoelectrochemical deposition, hot-injection, another suitable deposition process, or any combination thereof. Although FIG. 26 illustrates a particular arrangement of substrate 2620, electrical contact 2622, light-absorbing layer 2640, semiconductor layer 2682, conducting layer 2686, and metal grid 2690, this disclosure contemplates any suitable arrangement of substrate 2620, electrical contact 2622, light-absorbing layer 2640, semiconductor layer 2682, conducting layer 2686, and metal grid 2690. For example, the position of semiconductor layer 2682 and light-absorbing layer 2640 may be switched, such that semiconductor layer 2682 may be deposited on substrate 2620 and light-absorbing layer 2640 may be deposited on semiconductor layer 2682. Moreover, although FIG. 26 illustrates a particular number of substrates 2620, electrical contacts 2622, light-absorbing layers 2640, semiconductor layers 2682, transparent conducting layers 2686, and metal grids 2690, this disclosure contemplates any suitable number of substrates 2620, electrical contacts 2622, light-absorbing layers 2640, semiconductor layers 2682, transparent conducting layers 2686, and metal grids 2690. For example, device stack 2600 may include multiple light-absorbing layers 2640 and semiconductor layers 2682, forming multiple p-n junctions. In addition, U.S. application Ser. No. 12/953,867, U.S. application Ser. No. 12/016,172, U.S. application Ser. No. 11/923,036, and U.S. application Ser. No. 11/923,070, the text of which are incorporated by reference herein, disclose additional layer arrangements and configurations for photovoltaic cell structures that may be used with particular embodiments disclosed herein. As used herein, reference to a layer may encompass a film, and vice versa, where appropriate. Additionally, reference to a layer or film may also encompass one or more layers or films, where appropriate.

In particular embodiments, substrate 2620 may be any suitable substrate capable of withstanding high temperatures and/or pressures. Substrate 2620 may provide structural support for the film stack. For example, substrate 2620 may be soda-lime glass, a metal sheet or foil (e.g., stainless steel, aluminum, tungsten), a semiconductor (e.g., Si, Ge, GaAs), a polymer, another suitable substrate, or any combination thereof. In particular embodiments, substrate 2620 may be coated with an electrical contact 2622. Electrical contact 2622 may be any suitable electrode material, such as, for example, Mo, W, Al, Fe, Cu, Sn, Zn, another suitable electrode material, or any combination thereof. If substrate 2620 is a non-transparent material, then conducting layer 2686 may be transparent to allow light penetration into the photoactive conversion layer. In particular embodiments, substrate 2620 may be replaced by another suitable protective layer or coating, or may be added during construction of a solar module or panel. Alternatively, device stack 2600 may be deposited on a flat substrate (such as a glass substrate intended for window installations), or directly on one or more surfaces of a non-imaging solar concentrator, such as a trough-like or Winston optical concentrator.

In particular embodiments, light-absorbing layer 2640 may be a chalcogenide thin-film as described herein, such as, for example, a CZTS, CIGS, or CdTe thin-film. As used here, reference to a precursor layer may encompass a light-absorbing layer, and vice versa, where appropriate. Light-absorbing layer 2640 may be either a p-type or an n-type semiconductor layer. In particular embodiments, device stack 2600 may include multiple light-absorbing layers. The plurality of light-absorbing layers may vary between CZTS thin-films, CIGS thin-film, CdTe thin-films, or other suitable light-absorbing layers. Although this disclosure describes particular types of light-absorbing layers 2640, this disclosure contemplates any suitable type of light-absorbing layer 2640. Although FIG. 26 illustrates particular light-absorbing layers with particular compositions and architectures, this disclosure contemplates any suitable light-absorbing layers with any suitable compositions or architectures. For example, additional constituents such as alkali metal salts, antimony, bismuth, another suitable constituent, or any combination thereof may be added to the light-absorbing layer 2640 to enhance its properties (e.g., grain size) or performance. As another example, to improve the electrical properties of the light-absorbing layer 2640 or to optimize the subsequent annealing process, the light-absorbing layer 2640 may contain up to approximately 20 atomic % of Al, Si, Ti, V, Zn, Ga, Zr, Nb, Mo, Ru, Pd, In, Sn, Ta, W, Re, Ir, Pt, Au, Pb, Bi, or any combination thereof. As yet another example, the light-absorbing layer may comprise up to approximately 10 atomic % of Na, Sb, Bi, or any combination thereof. As yet another example, the light-absorbing layer 2640 may comprise amorphous chalcogenide material.

In particular embodiments, semiconductor layer 2682 may form a p-n junction with light-absorbing layer 2640. Semiconductor layer 2682 may be either a p-type or an n-type semiconductor layer. In particular embodiments, semiconductor layer 2682 may include one or more of the following semiconductor materials: silicon (Si), germanium (Ge), tin (Sn), beta iron silicide ($\beta$-FeSi$_2$), indium antimony (InSb), indium arsenic (InAs), indium phosphate (InP), gallium phosphate (GaP), aluminum phosphate (AlP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenide (CdSe), cadmium telluride (CdTe), zinc sulfide (ZnS), zinc selenide (ZnSe), zinc telluride (ZnTe), tin telluride (SnTe), copper sulfide ($Cu_{1-x}S$ (x varies from 1 to 2)), copper selenide ($Cu_{1-x}Se$ (x varies from 1 to 2)), copper indium disulfide ($CuInS_2$), copper gallium disulfide ($CuGaS_2$), copper indium gallium disulfide, ($Cu(In_{1-x}Ga_x)S_2$ (x varies from 0 to 1)), copper indium diselenide ($CuInSe_2$), copper gallium diselenide ($CuGaSe_2$), copper indium gallium diselenide ($Cu(In_{1-x}Ga_x)Se_2$ (x varies from 0 to 1)), copper silver indium gallium disulfide—$(Cu_{1-x}Ag_x)(In_{1-y}Ga_y)S_2$ (x varies from 0 to 1, y varies from 0 to 1)), copper silver indium gallium diselenide ($Cu_{1-x}Ag_x)(In_{1-y}Ga_y)Se_2$ (x varies from 0 to 1, y varies from 0 to 1)), $(Cu_{1-x}Au_x)InS_2$ (x varies from 0 to 1), $(Cu_{1-x}Au_x)CuGaS_2$ (x varies from 0 to 1), $(Cu_{1-x}Au_x)(In_{1-y}Ga_y)S_2$ (x varies from 0 to 1, y varies from 0 to 1), $(Cu_{1-x}Au_x)InSe_2$ (x varies from 0 to 1), $(Cu_{1-x}Au_x)GaSe_2$ (x varies from 0 to 1), $(Cu_{1-x}Au_x)(In_{1-x}Ga_x)Se_2$ (x varies from 0 to 1), $(Ag_{1-x}Au_x)(In_{1-x}Ga_x)Se_2$ (x varies from 0 to 1), $(Cu_{1-x-y}Ag_xAu_y)(In_{1-z}Ga_z)Se_2$ (x varies from 0 to 1, y varies from 0 to 1, z varies from 0 to 1), $(Cu_{1-x}Au_x)_2S$ (x varies from 0 to 1), $(Ag_{1-x}Au_x)_2S$ (x varies from 0 to 1), $(Cu_{1-x-y}Ag_xAu_y)_2S$ (x varies from 0 to 1, y varies from 0 to 1), indium sulfide ($In_2S_3$), indium selenide ($In_2Se_3$), aluminum nitride (AlN), indium nitride (InN), gallium nitride (GaN), bismuth sulfide ($Bi_2S_3$), antimony sulfide ($Sb_2S_3$), silver sulfide ($Ag_2S$), tungsten sulfide ($WS_2$), tungsten selenide ($WSe_2$), molybdenum sulfide ($MoS_2$), molybdenum selenide ($MoSe_2$), tin sulfide ($SnS_x$ (x varies from 1 to 2)), tin selenide ($SnSe_x$ (x varies from 1 to 2)), or copper tin sulfide ($Cu_4SnS_4$). In particular embodiments, one or more of light-absorbing layer 2640 or semiconductor layer 2682 may also contain up to 80 vol. % of an oxide material selected from the group consisting of magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

In particular embodiments, semiconductor layer 2682 may include one or more of the following n-type semiconductor materials: silicon (Si), germanium (Ge), tin (Sn), beta iron silicide ($\beta$-$FeSi_2$), indium antimony (InSb), indium arsenic (InAs), indium phosphate (InP), gallium phosphate (GaP), aluminum phosphate (AlP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide ($Cu_{1-x}S$ (x varies from 1 to 2)), copper selenide ($Cu_{1-x}Se$ (x varies from 1 to 2)), copper indium disulfide ($CuInS_2$), copper gallium disulfide ($CuGaS_2$), copper indium gallium disulfide, ($Cu(In_{1-x}Ga_x)S_2$ (x varies from 0 to 1)), copper indium diselenide ($CuInSe_2$), copper gallium diselenide ($CuGaSe_2$), copper indium gallium diselenide ($Cu(In_{1-x}Ga_x)Se_2$ (x varies from 0 to 1)), copper silver indium gallium disulfide—$(Cu_{1-x}Ag_x)(In_{1-y}Ga_y)S_2$ (x varies from 0 to 1, y varies from 0 to 1)), copper silver indium gallium diselenide ($Cu_{1-x}Ag_x)(In_{1-y}Ga_y)Se_2$ (x varies from 0 to 1, y varies from 0 to 1)), $(Cu_{1-x}Au_x)InS_2$ (x varies from 0 to 1), $(Cu_{1-x}Au_x)CuGaS_2$ (x varies from 0 to 1), $(Cu_{1-x}Au_x)(In_{1-y}Ga_y)S_2$ (x varies from 0 to 1, y varies from 0 to 1), $(Cu_{1-x}Au_x)InSe_2$ (x varies from 0 to 1), $(Cu_{1-x}Au_x)GaSe_2$ (x varies from 0 to 1), $(Cu_{1-x}Au_x)(In_{1-x}Ga_x)Se_2$ (x varies from 0 to 1), $(Ag_{1-x}Au_x)(In_{1-x}Ga_x)Se_2$ (x varies from 0 to 1), $(Cu_{1-x-y}Ag_xAu_y)(In_{1-z}Ga_z)Se_2$ (x varies from 0 to 1, y varies from 0 to 1, z varies from 0 to 1), $(Cu_{1-x}Au_x)_2S$ (x varies from 0 to 1), $(Ag_{1-x}Au_x)_2S$ (x varies from 0 to 1), $(Cu_{1-x-y}Ag_xAu_y)_2S$ (x varies from 0 to 1, y varies from 0 to 1), indium sulfide ($In_2S_3$), indium selenide ($In_2Se_3$), aluminum nitride (AlN), indium nitride (InN), gallium nitride (GaN), bismuth sulfide ($Bi_2S_3$), antimony sulfide ($Sb_2S_3$), silver sulfide ($Ag_2S$), tungsten sulfide ($WS_2$), tungsten selenide ($WSe_2$), molybdenum sulfide ($MoS_2$), molybdenum selenide ($MoSe_2$), tin sulfide ($SnS_x$ (x varies from 1 to 2)), tin selenide ($SnSe_x$ (x varies from 1 to 2)), copper tin sulfide ($Cu_4SnS_4$). Such semiconductors may be doped by adding an impurity of valence-five elements such as nitrogen (N), phosphorus (P), arsenic (As), or antimony (Sb)).

In particular embodiments, semiconductor layer 2682 may include one or more of the following p-type semiconductor materials: silicon (Si), germanium (Ge), tin (Sn), beta iron silicide ($\beta$-$FeSi_2$), indium antimony (InSb), indium arsenic (InAs), indium phosphate (InP), gallium phosphate (GaP), aluminum phosphate (AlP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide ($Cu_{1-x}S$ (x varies from 1 to 2)), copper selenide ($Cu_{1-x}Se$ (x varies from 1 to 2)), copper indium disulfide ($CuInS_2$), copper gallium disulfide ($CuGaS_2$), copper indium gallium disulfide, ($Cu(In_{1-x}Ga_x)S_2$ (x varies from 0 to 1)), copper indium diselenide ($CuInSe_2$), copper gallium diselenide ($CuGaSe_2$), copper indium gallium diselenide ($Cu(In_{1-x}Ga_x)Se_2$ (x varies from 0 to 1)), copper silver indium gallium disulfide ($Cu_{1-x}Ag_x)(In_{1-y}Ga_y)S_2$ (x varies from 0 to 1, y varies from 0 to 1)), copper silver indium gallium diselenide ($Cu_{1-x}Ag_x)(In_{1-y}Ga_y)Se_2$ (x varies from 0 to 1, y varies from 0 to 1)), $(Cu_{1-x}Au_x)InS_2$ (x varies from 0 to 1), $(Cu_{1-x}Au_x)CuGaS_2$ (x varies from 0 to 1), $(Cu_{1-x}Au_x)(In_{1-y}Ga_y)S_2$ (x varies from 0 to 1, y varies from 0 to 1), $(Cu_{1-x}Au_x)InSe_2$ (x varies from 0 to 1), $(Cu_{1-x}Au_x)GaSe_2$ (x varies from 0 to 1), $(Cu_{1-x}Au_x)(In_{1-x}Ga_x)Se_2$ (x varies from 0 to 1), $(Ag_{1-x}Au_x)(In_{1-x}Ga_x)Se_2$ (x varies from 0 to 1), $(Cu_{1-x-y}Ag_xAu_y)(In_{1-z}Ga_z)Se_2$ (x varies from 0 to 1, y varies from 0 to 1, z varies from 0 to 1), $(Cu_{1-x}Au_x)_2S$ (x varies from 0 to 1), $(Ag_{1-x}Au_x)_2S$ (x varies from 0 to 1), $(Cu_{1-x-y}Ag_xAu_y)_2S$ (x varies from 0 to 1, y varies from 0 to 1), indium sulfide ($In_2S_3$), indium selenide ($In_2Se_3$), aluminum nitride (AlN), indium nitride (InN), gallium nitride (GaN), bismuth sulfide ($Bi_2S_3$), antimony sulfide ($Sb_2S_3$), silver sulfide ($Ag_2S$), tungsten sulfide ($WS_2$), tungsten selenide ($WSe_2$), molybdenum sulfide ($MoS_2$), molybdenum selenide ($MoSe_2$), tin sulfide ($SnS_x$ (x varies from 1 to 2)), tin selenide ($SnSe_x$ (x varies from 1 to 2)), copper tin sulfide ($Cu_4SnS_4$). Such semiconductors may be doped by adding an impurity of valence-three elements such as boron (B), gallium (Ga), indium (In), or aluminum (Al), in order to increase the number of free (in this case positive (hole)) charge carriers. In particular embodiments, semiconductor layer 2682 may also contain up to 80 vol. % of one or more of the following oxide materials: magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge)

oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, or bismuth (Bi) oxide.

In particular embodiments, conducting layer 2686 may be a transparent conducting oxide. In particular embodiments, conducting layer 2686 may include one or more of the following conducting oxide materials: titanium oxide (e.g., one or more of TiO, $TiO_2$, $Ti_2O_3$, or $Ti_3O_5$), aluminum oxide (e.g., $Al_2O_3$), cobalt oxide (e.g., one or more of CoO, $Co_2O_3$, or $Co_3O_4$), silicon oxide (e.g., $SiO_2$), tin oxide (e.g., one or more of SnO or $SnO_2$), zinc oxide (e.g., ZnO), molybdenum oxide (e.g., one or more of Mo, $MoO_2$, or $MoO_3$), tantalum oxide (e.g., one or more of TaO, $TaO_2$, or $Ta_2O_5$), tungsten oxide (e.g., one or more of $WO_2$ or $WO_3$), indium oxide (e.g., one or more of InO or $In_2O_3$), magnesium oxide (e.g., MgO), bismuth oxide (e.g., $Bi_2O_3$), copper oxide (e.g., CuO), vanadium oxide (e.g., one or more of VO, $VO_2$, $V_2O_3$, $V_2O_5$, or $V_3O_5$), chromium oxide (e.g., one or more of $CrO_2$, $CrO_3$, $Cr_2O_3$, or $Cr_3O_4$), zirconium oxide (e.g., $ZrO_2$), or yttrium oxide (e.g., $Y_2O_3$). Additionally, in particular embodiments, conducting layer 2686 may be doped with one or more of a variety of suitable elements or compounds. For example, conducting layer 2686 may comprise ZnO or $In_2O_3$ doped with one or more of aluminum oxide, titanium oxide, zirconium oxide, vanadium oxide, or tin oxide. In another particular embodiment, conducting layer 2686 may be a multi-layer structure comprising a first layer comprising one or more of zinc oxide, aluminum oxide, titanium oxide, zirconium oxide, vanadium oxide, or tin oxide, and a second layer comprising ZnO or $In_2O_3$ doped with one or more of aluminum oxide, titanium oxide, zirconium oxide, vanadium oxide, or tin oxide.

In particular embodiments, conducting layer 2686 may be replaced by metal grid 2690. Metal grid 2690 may be deposited using screen-printing. Metal grid 2690 may be arranged in a grid (e.g., fingers and busbars) on one side (or both sides) and a full area metal contact on the other side. Additional layers, such as anti-reflection coatings may also be added.

The layers of device stack 2600 may be deposited using any suitable process. In particular embodiments, one or more of the layers of device stack may be deposited (e.g., by conventional sputtering or magnetron sputtering) in vacuum or in an atmosphere that includes at least one of the following gases: Ar, H, $N_2$, $O_2$, $H_2S$, and $H_2Se$. In particular embodiments, one or more of the layers of the multilayer structures described above may be doped (e.g., up to approximately 4 atomic %) with at least one of the following elements: Na, P, K, N, B, As, and Sb.

Miscellaneous

Herein, "or" is inclusive and not exclusive, unless expressly indicated otherwise or indicated otherwise by context. Moreover, "and" is both joint and several, unless expressly indicated otherwise or indicated otherwise by context. Furthermore, "a," "an," or "the" is intended to mean "one or more," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, this disclosure encompasses any suitable combination of one or more features from any example embodiment with one or more features of any other example embodiment herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method comprising:
    depositing a precursor layer onto a substrate, the precursor layer comprising chalcogenide material with one or more volatile species; and
    annealing the precursor layer in the presence of a gaseous phase comprising one or more of the volatile species, the partial pressure of each volatile species being approximately constant over substantially all of the surface of the precursor layer,
    the partial pressure of each species being between approximately 0.1 mTorr and 760 Torr, wherein the presence of the gaseous phase reduces decomposition of the volatile species from the precursor layer during annealing.

2. The method of claim 1, wherein annealing comprises:
    generating a vacuum of approximately 1 mTorr to 0.001 mTorr;
    heating the precursor layer to a first temperature of approximately 350 degrees Celsius to approximately 700 degrees Celsius at a rate of approximately 50 degrees Celsius/minute;
    introducing the gaseous phase in the presence of the precursor layer, the partial pressure of each species of the gaseous phase being between approximately 0.1 mTorr and 760 Torr;
    holding the precursor layer at the first temperature for approximately 5 minutes to approximately 120 minutes;
    cooling the precursor layer to a second temperature below approximately 200 degrees Celsius at a rate of approximately 50 degrees Celsius/minute.

3. The method of claim 1, wherein during annealing the rate of desorption of the volatile species from the precursor layer is approximately equal to the rate of absorption of the volatile species by the precursor layer from the gaseous phase.

4. The method of claim 1, wherein the precursor layer comprises Cu, Zn, and Sn, and one or more of S or Se; and wherein the volatile species comprise one or more of Sn, S, or Se.

5. The method of claim 4, wherein the precursor layer comprises $Cu_xZn_ySn_a(S_zSe_{1-z})$, and wherein approximately $0.5 \leq x \leq 3$, $y=1$, $0 \leq z \leq 1$, $0.5 \leq a \leq 3$, and $0 \leq \beta \leq 5$.

6. The method of claim 1, wherein the precursor layer comprises Cu, one or more of In or Ga, and one or more of S or Se; and wherein the volatile species comprise one or more of In, S, or Se.

7. The method of claim 6, wherein the precursor layer comprises $CU_x(In_yGa_{1-y})_a(S_zSe_{1-z})\beta$, and wherein approximately $0.1 \leq x \leq 0.7$, $0 \leq y \leq 1$, $0 \leq z \leq 1$, $0.3 \leq a \leq 0.8$, and $\beta=1$.

8. The method of claim 1, wherein the annealing is performed in a constrained volume.

9. The method of claim 1, wherein the annealing is performed in a furnace.

10. The method of claim 9, wherein during annealing, a temperature of the furnace walls is approximately 5 degrees Celsius to approximately 50 degrees Celsius greater than a temperature of the precursor layer, and wherein the volatile species from the gaseous phase preferentially deposits onto the precursor layer compared to the furnace walls.

11. The method of claim 1, wherein the partial pressure of each component of the gaseous phase is kept approximately constant over substantially all of the surface of the precursor layer by controlling the inlet and outlet gas flow rates.

12. The method of claim 1, wherein the partial pressure of each component of the gaseous phase is kept approximately constant over substantially all of the surface of the precursor layer by using a uniform vapor distribution system.

13. The method of claim 12, wherein the uniform vapor distribution system comprises a heated gas path that prevents condensation of the volatile species from the gaseous phase.

14. The method of claim 1, wherein the partial pressure of each component of the gaseous phase is kept approximately constant over substantially all of the surface of the precursor layer by controlling a reservoir temperature of a reservoir comprising the volatile species.

15. The method of claim 14, wherein the reservoir temperature is greater than the melting point of the volatile species.

16. The method of claim 1, wherein the partial pressure of each component of the gaseous phase is kept approximately constant over substantially all of the surface of the precursor layer for substantially all of the duration of the annealing.

17. The method of claim 1, wherein the gaseous phase comprises gaseous sulfur, gaseous sulfur compounds, gaseous selenium, gaseous selenium compounds, or any combination thereof.

18. The method of claim 17, wherein the gaseous sulfur IS at a partial pressure of approximately 10 mTorr to approximately 100 Torr.

19. The method of claim 17, wherein the gaseous sulfur comprises $S_2$ gas, $S_8$ gas, or any combination thereof.

20. The method of claim 17, wherein the gaseous sulfur compounds comprise H2S gas.

21. The method of claim 17, wherein the gaseous selenium compounds comprise $H_2Se$ gas, SnS gas, or any combination thereof.

22. The method claim 1, wherein the gaseous phase further comprises a carrier gas.

23. The method of claim 22, wherein the carrier gas comprises one or more of Ar or $N_2$.

24. The method of claim 22, wherein the carrier gas is at a partial pressure of approximately 0.1 mTorr to approximately 760 Torr.

\* \* \* \* \*